United States Patent
Choi et al.

(10) Patent No.: US 11,189,533 B2
(45) Date of Patent: Nov. 30, 2021

(54) WAFER QUALITY INSPECTION METHOD AND APPARATUS, AND SEMICONDUCTOR DEVICE MANUFACTURING METHOD INCLUDING THE WAFER QUALITY INSPECTION METHOD

(71) Applicant: SAMSUNG ELECTRONICS CO., LTD., Suwon-si (KR)

(72) Inventors: Jong-Hyun Choi, Suwon-si (KR); Seok-Bae Moon, Hwaseong-si (KR); Jae-Hyuk Choi, Seoul (KR); Won-Ki Park, Seoul (KR); Jong-Hwi Seo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/390,345

(22) Filed: Apr. 22, 2019

(65) Prior Publication Data

US 2020/0091012 A1    Mar. 19, 2020

(30) Foreign Application Priority Data

Sep. 13, 2018    (KR) .................. 10-2018-0109722

(51) Int. Cl.
*H01L 21/265*    (2006.01)
*H01L 21/66*    (2006.01)
*H01J 37/317*    (2006.01)

(52) U.S. Cl.
CPC .......... *H01L 22/12* (2013.01); *H01J 37/3171* (2013.01); *H01L 22/20* (2013.01);
(Continued)

(58) Field of Classification Search
CPC ....... H01L 22/12; H01L 22/20; H01L 21/265; H01J 37/3171; H01J 2237/24507; H01J 2237/24592
See application file for complete search history.

(56) References Cited

U.S. PATENT DOCUMENTS 6,291,820 B1    9/2001    Hamza et al.
6,677,599 B2    1/2004    Berrian
(Continued)

FOREIGN PATENT DOCUMENTS

JP    2002-358921    12/2002
JP    2018-162607    * 8/2018
(Continued)

OTHER PUBLICATIONS

Current, Michael I., Ion Implantation for Fabrication of Semiconductor Devices and Materials, Current Scientific, Feb. 20, 2012, pp. 1-48.

*Primary Examiner* — Timor Karimy
(74) *Attorney, Agent, or Firm* — F. Chau & Associates, LLC

(57) ABSTRACT

A method of inspecting a wafer quality includes injecting ions into a wafer using an ion beam in an ion implantation process, collecting data about the ion beam by using a Faraday cup, extracting first data from the data about the ion beam, extracting a wafer section from the first data, calculating a feature value of a wafer from the wafer section, and evaluating a quality of the wafer by comparing the feature value with a predetermined threshold or range.

15 Claims, 19 Drawing Sheets

(52) U.S. Cl.
CPC ............... *H01J 2237/24507* (2013.01); *H01J 2237/24592* (2013.01); *H01L 21/265* (2013.01)

(56) References Cited

U.S. PATENT DOCUMENTS

| | | | |
|---|---|---|---|
| 7,547,460 B2 | 6/2009 | Cucchetti et al. | |
| 7,586,110 B1 * | 9/2009 | Low | H01J 37/244 250/309 |
| 7,663,125 B2 | 2/2010 | Callahan et al. | |
| 2009/0166557 A1 * | 7/2009 | Makino | H01J 37/026 250/442.11 |
| 2020/0074611 A1 * | 3/2020 | Dou | G06N 3/08 |

FOREIGN PATENT DOCUMENTS

| | | |
|---|---|---|
| KR | 1020070075860 | 7/2007 |
| KR | 1020070089300 | 8/2007 |
| KR | 10-0908820 | 7/2009 |

\* cited by examiner

WAFER QUALITY INSPECTION METHOD AND APPARATUS, AND SEMICONDUCTOR DEVICE MANUFACTURING METHOD INCLUDING THE WAFER QUALITY INSPECTION METHOD

CROSS-REFERENCE TO RELATED APPLICATION

This application claims priority under 35 U.S.C. § 119 to Korean Patent Application No. 10-2018-0109722, filed on Sep. 13, 2018 in the Korean Intellectual Property Office, the disclosure of which is incorporated by reference herein in its entirety.

TECHNICAL FIELD

Exemplary embodiments of the inventive concept relate to a wafer quality inspection method and apparatus, and more particularly, to a wafer quality inspection method and apparatus for an ion implantation method.

DISCUSSION OF RELATED ART

In an ion implantation (IMP) process, ions are injected into a wafer. After ionizing an impurity, required ions are selected and accelerated to form an ion beam. A desired amount of the ion beam is injected into a wafer surface to bury the ions in a semiconductor crystal lattice in the wafer. The wafer may acquire conductivity of an appropriate level through the ions buried in the wafer. An amount of ions injected into the wafer is referred to as a dose, and the equipment for the IMP process may include a dose controller that controls the dose. Various methods have been suggested to maintain a constant and uniform ion beam and inject a required dose into a wafer.

With regards to the IMP process, examples of wafer quality evaluation include a secondary ion mass spectroscopy (SIMS) method, a thermal wave (TW) method, and an electrical die sorting (EDS) method. In the SIMS method, a composition and components of a sample wafer are identified by surface analysis of the sample wafer, and this method takes about two weeks. Once used, sample wafers are damaged and thus are disposed of, and thus total inspection is impossible. The TW method is a nondestructive inspection method in which an acquired TW signal is used to inspect damage to a wafer surface. However, due to diverse factors affecting a TW signal in the TW method, a correlation between the IMP process and wafer defects is insufficient, and thus, total inspection is also impossible. In the EDS method, a wafer is inspected through an electrical test on dies, and this method is performed about two months after an IMP process, and thus, wafers processed in defective equipment during this period may all be determined to be defective and discarded.

SUMMARY

According to an exemplary embodiment of the inventive concept, a method of inspecting a wafer quality may include collecting data about an ion beam by using a Faraday cup in an ion implantation process, extracting first data from the data about the ion beam, extracting a wafer section from the first data, calculating a feature value of a wafer from the wafer section, and evaluating a quality of the wafer based on the feature value.

According to an exemplary embodiment of the inventive concept, a method of manufacturing a semiconductor device may include collecting data about an ion beam by using a Faraday cup in an ion implantation process, extracting first data from the data about the ion beam, extracting a wafer section from the first data, calculating a feature value of a wafer from the wafer section, evaluating a quality of the wafer based on the feature value, and performing a semiconductor process on the wafer when the quality of the wafer is normal. The quality of the wafer may be determined as normal by comparing the feature value with a predetermined threshold or range.

According to an exemplary embodiment of the inventive concept, a wafer quality inspecting apparatus may include an ion source configured to ionize a source material gas and output ionized gas, a mass analyzer configured to adjust a magnetic field intensity to select ions to be injected from among ions from the ion source, an accelerator configured to accelerate the ions to be injected, to form an ion beam, a scanner configured to form the ion beam into a linear form and inject the ion beam into a wafer, a dose controller configured to control a total amount of ions injected into the wafer based on data about the ion beam measured by using a Faraday cup, and an analysis and evaluation device configured to analyze a quality of the wafer based on the data about the ion beam. The analysis and evaluation device may include an effective data extractor configured to extract first data from the data about the ion beam, a wafer section extractor configured to extract a wafer section from the first data, a feature value calculator configured to calculate a feature value about the wafer from the wafer section, and a quality evaluator configured to evaluate a quality of the wafer based on the feature value.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
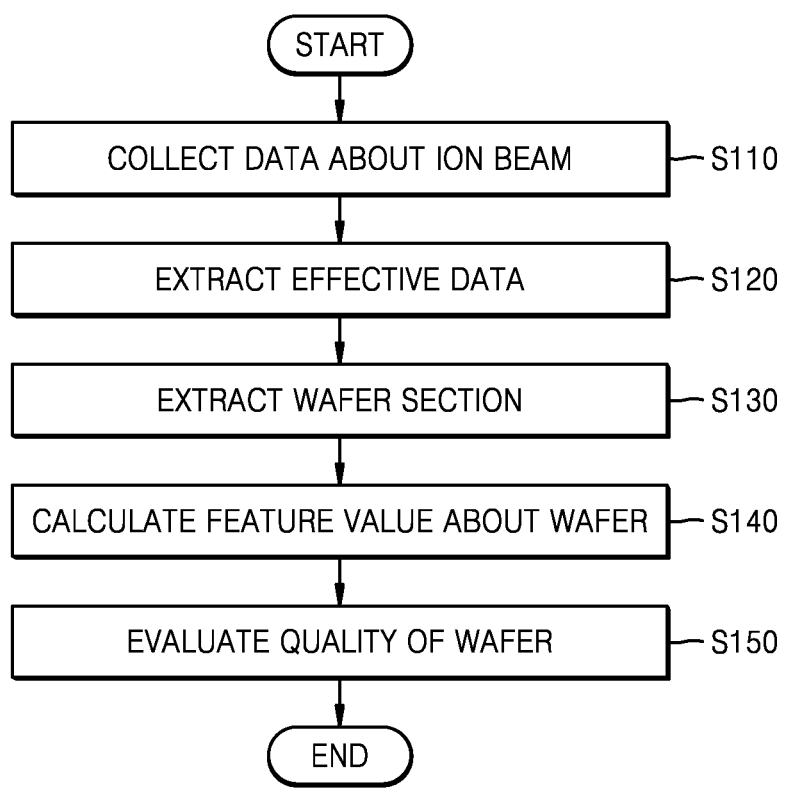
FIG. 1 is a flowchart of a wafer quality inspection method according to an exemplary embodiment of the inventive concept.

Exemplary embodiments of the inventive concept provide a wafer quality inspection method and apparatus, in which a quality of all wafers in an ion implantation (IMP) process, a state of an ion beam, and an abnormality of equipment are accurately inspected in real time, and a semiconductor device manufacturing method including the wafer quality inspection method.

Hereinafter, exemplary embodiments of inventive concept are described in detail with reference to the accompanying drawings. Like reference numerals may refer to like elements throughout this application.

FIG. 1 is a flowchart of a wafer quality inspection method according to an exemplary embodiment of the inventive concept.

Referring to FIG. 1, the wafer quality inspection method according to the present exemplary embodiment may refer to inspecting a wafer quality in an ion implantation (IMP) process. In addition, a wafer quality may be determined based on whether an amount of ions, e.g., an ion dose, is injected at a required level at an appropriate position of a wafer. The wafer quality inspection method according to the present exemplary embodiment may be performed as follows. First, data about an ion beam is collected (S110). In an IMP process, data about an ion beam may be collected by using a Faraday cup. For example, data about an ion beam may be an intensity of the ion beam and may be collected using a closed loop Faraday cup from among various types of Faraday cups. Collecting of data about an ion beam by using a Faraday cup will be described in detail with reference to FIGS. 2A through 2C.

Next, effective data is extracted from the collected data about the ion beam (S120). The IMP process may include a setup mode in which a device is initially set up and a scan mode in which ions are substantially injected into a wafer. Data about the ion beam may include data of a scan mode and data of a setup mode. In addition, data about the ion beam may also include data of an interruption mode or a park mode in which the IMP process is temporarily interrupted, data about noise, or the like. In inspecting a wafer quality, only data about a scan mode, e.g., a mode in which ions are actually injected into a wafer, may be needed, and data about other modes or noise may be unnecessary. Thus, in the operation of extracting effective data (S120), unsuitable data may be removed and only data needed in wafer quality inspection may be extracted. In other words, the effective data may be data included in the data about the ion beam that is remaining or left after removing the unsuitable data. The effective data may be referred to as first data, and the unsuitable data may be referred to as second data that is different from the first data. Extraction of effective data will be described in further detail with reference to FIGS. 3A through 3D.

Next, a wafer section is extracted from effective data (S130). Effective data may include scan mode sections of not just one wafer but several wafers. In addition, there may be a scan mode section in which an ion beam is irradiated when wafers are replaced. Accordingly, effective data may be segmented further and distinguished. A wafer section may refer to a section regarding one wafer. For example, a wafer section may refer to a data section with respect to an ion beam corresponding to one wafer. Extraction of a wafer section will be described in further detail with reference to FIGS. 4A and 4B.

After extracting the wafer section, a feature value of a wafer is calculated (S140). In other words, a feature value is calculated from data about an ion beam corresponding to a wafer section, e.g., one wafer. The feature value may be a reference for determining a wafer quality. More kinds of feature values may contribute to determining a more accurate wafer quality. Determining a wafer quality and calculating a feature value of a wafer will be described in more detail with reference to FIGS. 5A through 6B.

Next, a wafer quality is evaluated based on the feature value (S150). Evaluation of a wafer quality may be performed using various methods. For example, a threshold may be set for each feature value, and a wafer quality may be determined based on whether each feature value of a wafer exceeds or falls short of the set threshold. Alternatively, a normal range may be set with respect to each feature value, and a wafer quality may be determined based on whether each feature value of a wafer to be inspected is within the set normal range.

Inspection of wafer quality may be performed according to product types, process recipes, and process equipment groups. For example, quality evaluation of all wafers related to an IMP process of a particular equipment may be performed based on feature values. In addition, a dispersity of each feature value of all wafers related to an IMP process of a particular equipment may also be calculated. In regard to an IMP process of a particular equipment, quality evaluation of all wafers and a dispersion of each feature value may be used later in diagnosing a state of the equipment and/or a state of an ion beam during the IMP process. Similarly, quality evaluation on wafers may be performed and a dispersity of feature values of wafers may be calculated according to product types and/or process recipes, and used later in diagnosing a state of corresponding processes according to product types and/or process recipes.

According to the wafer quality inspection method of the present exemplary embodiment, in an IMP process, data about an ion beam is collected in real time by using a Faraday cup, a feature value about a wafer is extracted from the collected data through several operations, and a quality of the wafer may be evaluated based on the feature value. Accordingly, according to the wafer quality inspection method of the present exemplary embodiment, a wafer quality may be accurately determined in real time.

According to the wafer quality inspection method of the present exemplary embodiment, by using data about an ion beam, which is collected in real time by using a Faraday cup, a wafer quality may be accurately determined in real time. Accordingly, loss due to a long period of time needed for the EDS method or the SIMS method, as described above, may be prevented, and unlike the SIMS method, the method according to the present exemplary embodiment may be performed in a nondestructive manner. In addition, unlike the TW method or the SIMS method in which only selected sample wafers are inspected, total inspection on all wafers may be performed.

Figure 2A:
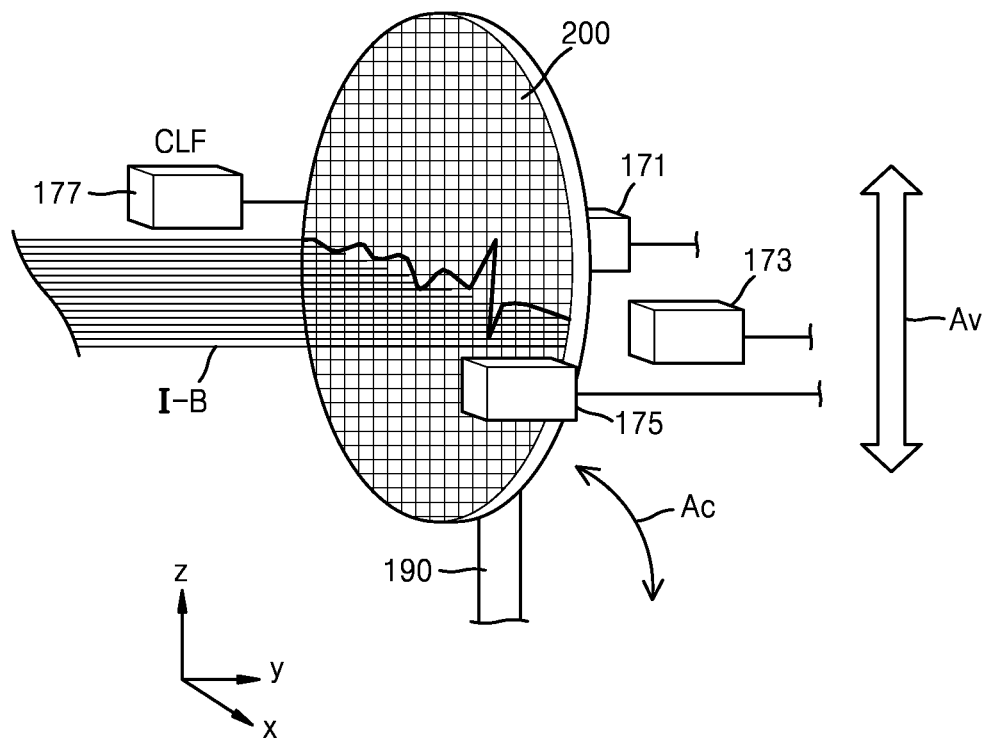
FIGS. 2A through 2C are respectively a perspective view, a structural block diagram, and a conceptual diagram for describing a process of collecting data about an ion beam in the wafer quality inspection method of FIG. 1 according to an exemplary embodiment of the inventive concept.
Figure 2B:
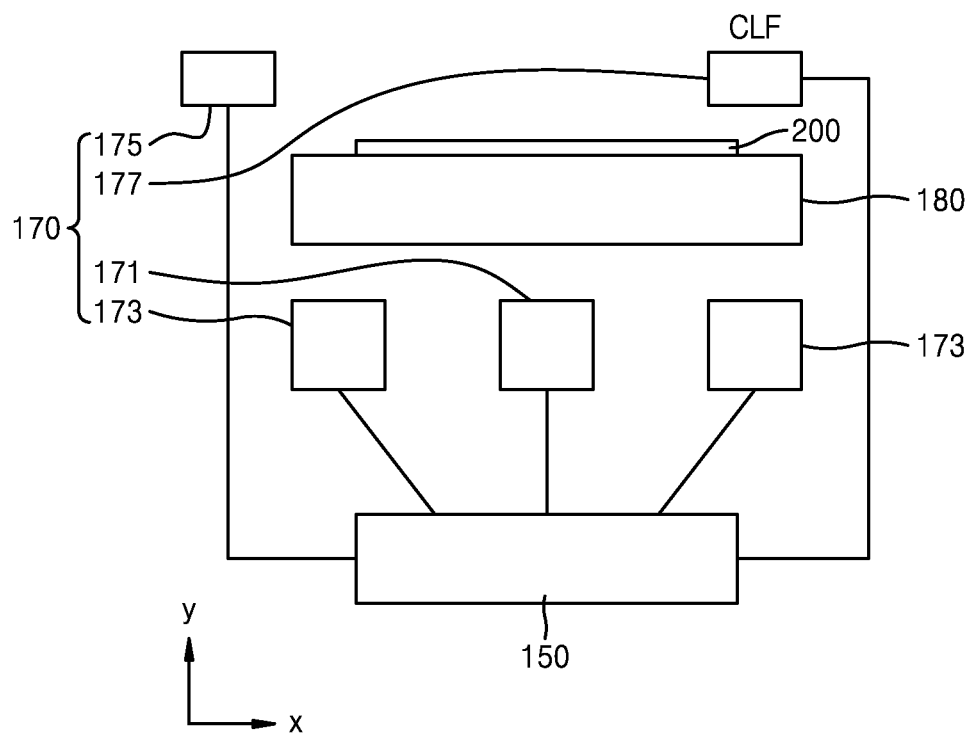
Figure 2C:
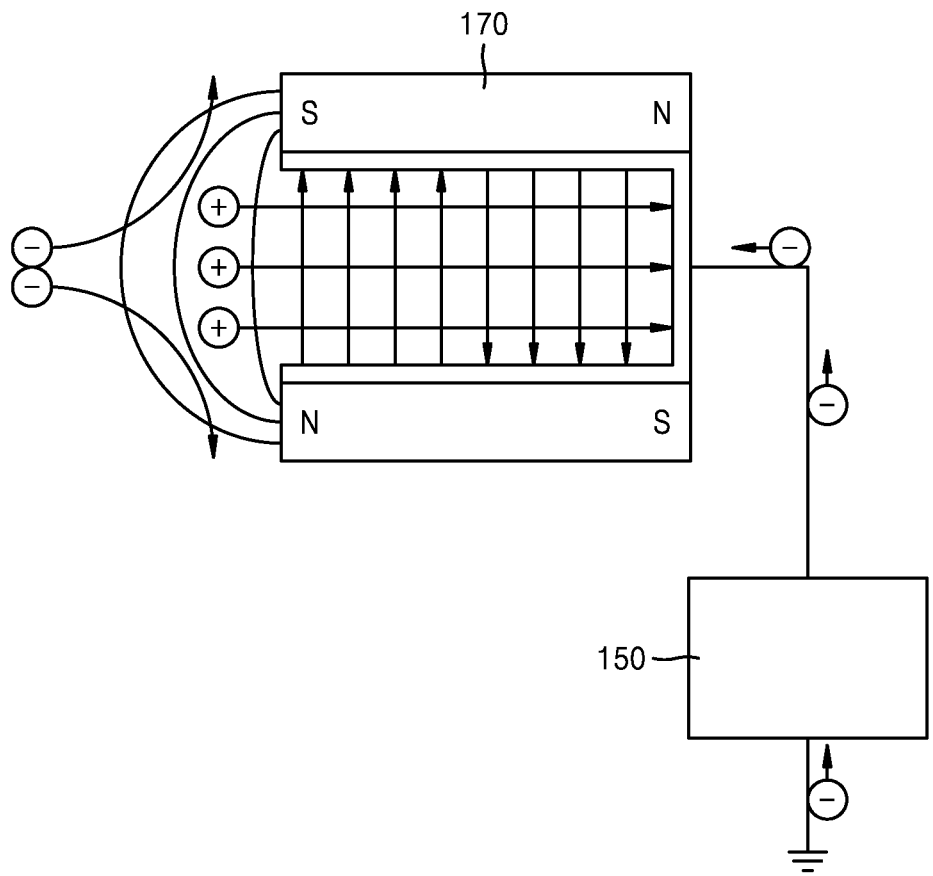

FIGS. 2A through 2C are respectively a perspective view, a structural block diagram, and a conceptual diagram for describing a process of collecting data about an ion beam in the wafer quality inspection method of FIG. 1 according to an exemplary embodiment of the inventive concept. FIGS. 2A and 2B are respectively a perspective view and a structural block diagram of a wafer and Faraday cups in an IMP process, and FIG. 2C is a conceptual diagram for describing the principle of a Faraday cup. Description of details already provided with reference to FIG. 1 will be briefly provided or omitted here.

Referring to FIGS. 2A and 2B, in regard to the wafer quality inspection method according to the present exemplary embodiment, in an IMP process, a wafer 200 may be placed perpendicular to a proceeding direction of an ion beam I-B or at a slight angle with respect to a direction perpendicular to the proceeding direction of the ion beam I-B. In detail, the ion beam I-B may be injected into the wafer 200 in the form of linear light, and an upper surface of the wafer 200 may be placed perpendicular to the proceeding direction of the ion beam I-B or at a slight angle with respect to the direction perpendicular to the proceeding direction of the ion beam I-B. The ion beam I-B in a linear form, e.g., a spot ion beam I-B, may be formed by shifting the spot ion beam I-B to the left or right. For example, each line in FIG. 2A may correspond to the spot ion beam I-B, and as the spot ion beam I-B is shifted in a first direction (x-direction), the ion beam I-B in a linear form may be formed.

Meanwhile, the wafer 200 may be placed on a stage 180 (as shown in FIG. 2B), and may be moved via a vertical axis 190 in a vertical direction, e.g., in a third direction (z-direction) as shown by a thick arrow Av, and thus ion implantation may be performed on the entire wafer 200. In addition, in an IMP process, the wafer 200 is typically moved reciprocally by the vertical axis 190, and the number of reciprocal movements may vary according to processes. When defining an operation of radiating the ion beam I-B to an entire wafer as one scan, two scans may be performed via one reciprocal movement. Meanwhile, the wafer 200 may be provided horizontally on the stage 180 in the IMP process equipment, and then may be moved via the vertical axis 190, as shown by a thin curved arrow Ac, to be placed perpendicularly or vertically.

As illustrated in FIGS. 2A and 2B, a Faraday cup 170 may be arranged around the wafer 200. The Faraday cup 170 may include a main Faraday cup 171, an incident angle Faraday cup 173, a profile Faraday cup 175, and a closed loop Faraday (CLF) cup 177. The main Faraday cup 171 may measure a test ion beam that may be used in checking an amount of an ion beam (e.g., I-B). The incident angle Faraday cup 173 is arranged on both sides of the main Faraday cup 171 and may detect outermost ion beams which may be used in setting up a width of a linear ion beam (e.g., I-B). In other words, the incident angle Faraday cup 173 may be used in setting up a range of movement of a spot ion beam (e.g., I-B) in the first direction (x-direction). The profile Faraday cup 175 may be used in checking a range of the spot ion beam (e.g., I-B), and also checking whether ions are normally injected in a scan mode in which ions are actually injected into a wafer (e.g., 200).

The main Faraday cup 171 and the incident angle Faraday cup 173 may be used in a setup mode in which a process is set up and may not be used in a scan mode in which ions are injected into the wafer 200. In addition, the main Faraday cup 171 and the incident angle Faraday cup 173 may be arranged at the back further behind a location where the wafer 200 is arranged, in a direction in which the ion beam I-B proceeds, e.g., a second direction (y-direction).

Meanwhile, the CLF cup 177 may be arranged in the first direction (x-direction) at a location corresponding to a location where the incident angle Faraday cup 173 is arranged. In addition, the CLF cup 177 may be arranged in the second direction (y-direction) at a location where the wafer 200 is or in front of the wafer 200. The CLF cup 177 may measure an ion beam in a scan mode. In other words, the CLF cup 177 may measure an ion beam that is in an identical state as an ion beam injected into the wafer 200. In detail, the ion beam I-B in a linear form is formed as the spot ion beam I-B is moved, and thus, ion beams in a same state may be irradiated within a width in the first direction (x-direction) corresponding to a line width of the ion beam I-B in a linear form. Meanwhile, as the CLF cup 177 is arranged at a substantially identical location to that of the incident angle Faraday cup 173 in the first direction (x-direction), the CLF cup 177 is arranged within a width of the ion beam I-B in a linear form, and thus, the ion-beam I-B in the same state as an ion beam injected into the wafer 200 may be radiated to the CLF cup 177. Accordingly, by measuring the ion-beam I-B by using the CLF cup 177, data about the ion beam injected into the wafer 200 may be measured.

Measurement of an ion beam by using the Faraday cup 170 may be performed by using a dose controller 150 connected to the Faraday cup 170. The measurement principle of an ion beam by using the Faraday cup 170 will be briefly described below with reference to FIG. 2C.

Referring to FIG. 2C, in the Faraday cup 170, a magnetic field is formed inside and outside the Faraday cup 170 as illustrated in the drawing, and negative ions such as electrons from among ions injected into an entrance of the cup are scattered in an outward direction of the cup, and only positive ions may enter the entrance of the cup. Meanwhile, to maintain electrical neutrality of the Faraday cup 170, electrons are input from ground and the dose controller 150 counts the electrons. In other words, the dose controller 150 does not directly measure an ion beam input in front of the Faraday cup 170, but counts the number of electrons that are input to maintain neutrality according to positive ions that have actually entered the Faraday cup 170, thus indirectly measuring the ion beam. Thus, through an indirect measurement method by using the Faraday cup 170, an amount of an ion beam that is actually injected into the wafer 200 may be measured.

In the wafer quality inspection method according to the present exemplary embodiment, data about an ion beam, collected by using the CLF cup 177, may be used in evaluation of a wafer quality. As described above, data about an ion beam, measured by using the CLF cup 177, may be substantially identical to data about an ion beam injected into the wafer 200. Accordingly, by processing data of an ion beam, collected by using the CLF cup 177, in a process described below, and using the processed data as a reference for evaluation of a wafer quality, the accuracy of the evaluation of a wafer quality may be increased.

For reference, data about the ion-beam I-B, measured by using the CLF cup 177, may be typically immediately discarded after measurement, or may be fed back and reflected in a subsequent process setup. In addition, according to process equipment, the CLF cup 177 may not be arranged. However, according to the wafer quality inspection method of the present exemplary embodiment, as the ion-beam I-B is measured by using the CLF cup 177, and thus, in an equipment without the CLF cup 177, the CLF cup 177 may be artificially arranged at a corresponding position. In addition, the CLF cup 177 may be individually separated and replaced.

FIGS. 3A through 3D are a flowchart and graphs showing a detailed process of effective data extraction in the wafer quality inspection method of FIG. 1 according to an exemplary embodiment of the inventive concept. In the graphs, the x-axis denotes a process time, the y-axis denotes an intensity of an ion beam, and the unit of the intensity may be an arbitrary unit. Description of details already provided above with reference to FIG. 1 will be briefly provided or omitted.

Referring to FIGS. 3A through 3D, in the process of effective data extraction, first, unsuitable data is removed from data about an ion beam, collected by using the Faraday cup 170 (S122). As described above, the collected data about the ion beam may include not only data in a scan mode in which ions are actually injected into a wafer, but also data in a setup mode or an interruption mode or data including noise. Thus, unsuitable data not necessary in determining a wafer quality is to be removed.

Figure 3A:
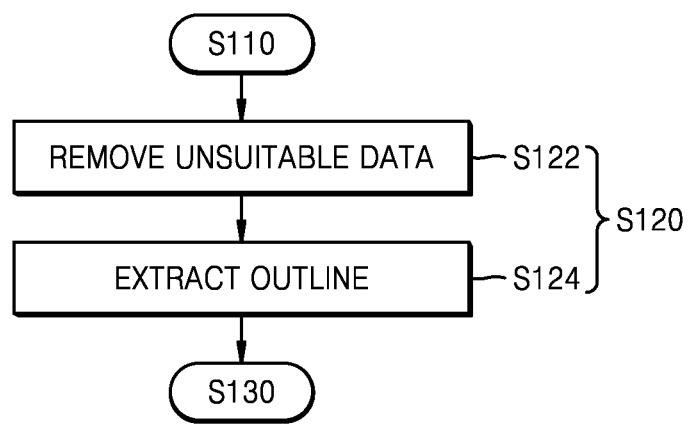
FIGS. 3A through 3D are a flowchart and graphs showing a detailed process of effective data extraction in the wafer quality inspection method of FIG. 1 according to an exemplary embodiment of the inventive concept.
Figure 3B:
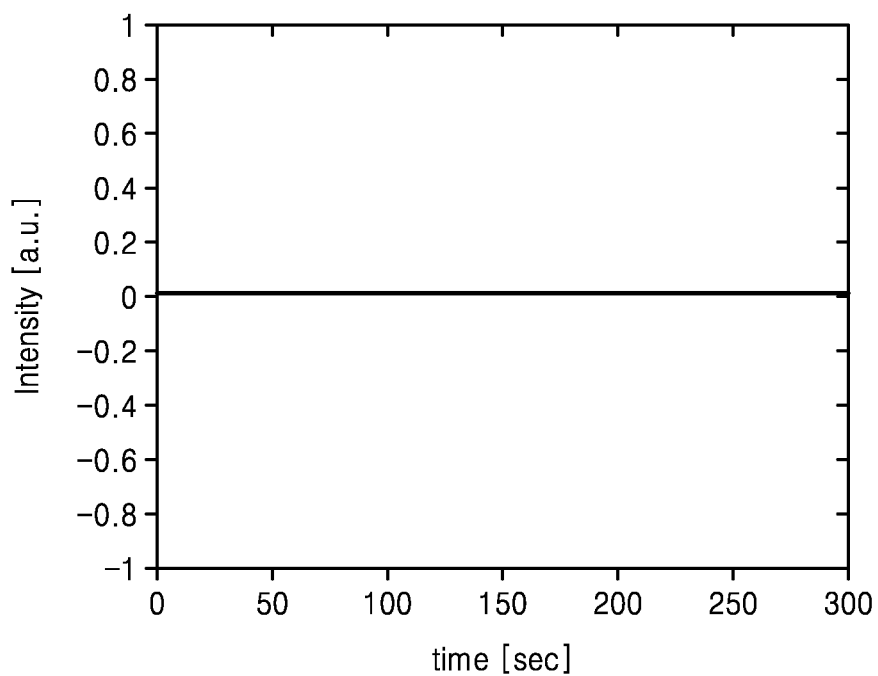
Figure 3C:
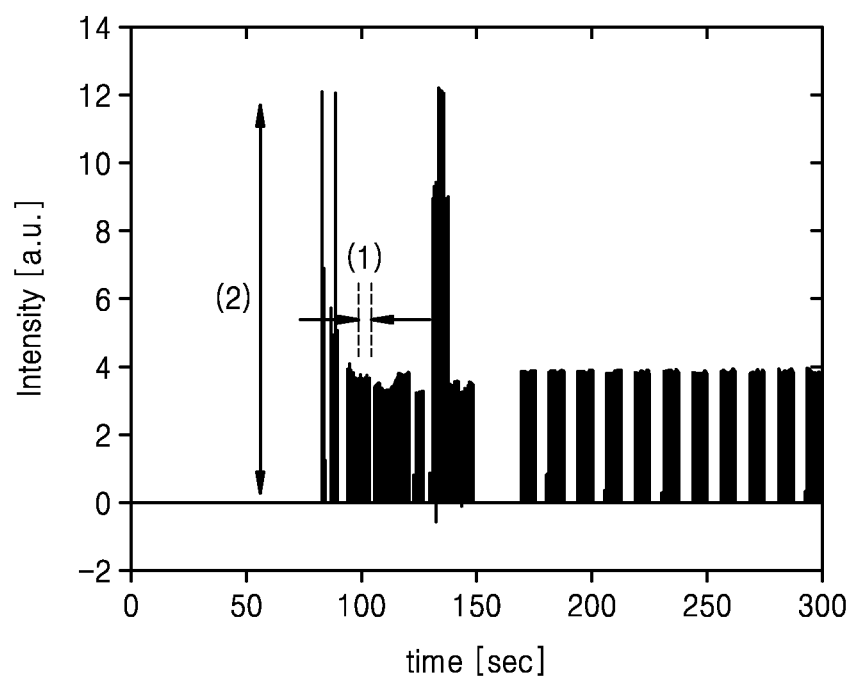

For example, when there is no data about the ion beam due to a process suspension or the like as illustrated in FIG. 3B, or when a width where ions are injected is smaller than an average (1) or when a beam intensity is excessively high (2) in a setup mode or the like as illustrated in FIG. 3C, such ion beam data corresponding to the above examples may be removed as unsuitable data. In other words, data extracted when the IMP process is suspended, as shown in FIG. 3B, may be removed as unsuitable data. The width where ions are injected is a period of time (e.g., in seconds) when the ions are injected, and data where a width is less than a predetermined threshold (e.g., an average width), as shown in FIG. 3C, may be removed as unsuitable data. Additionally, data where an intensity of the ion beam is greater than a predetermined threshold, e.g., during the setup mode, may be removed as unsuitable data.

Figure 3D:
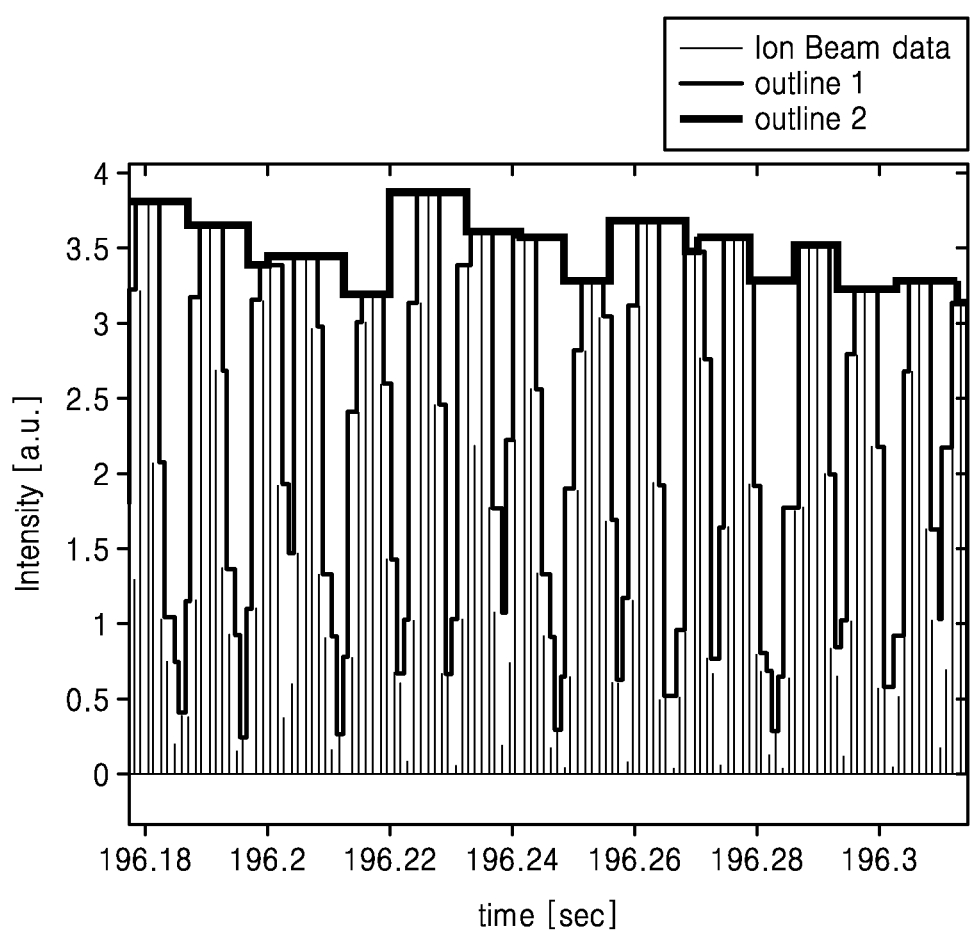

Next, an outline is extracted from the data about the ion beam (S124). As illustrated in FIG. 3D, an outline may have various shapes, such as an outline 1 that surrounds upper and lateral outer portions of some pieces of data or an outline 2 surrounding only upper portions of the entire data. The outline may be used later in extracting a feature value with respect to a wafer.

Figure 4A:
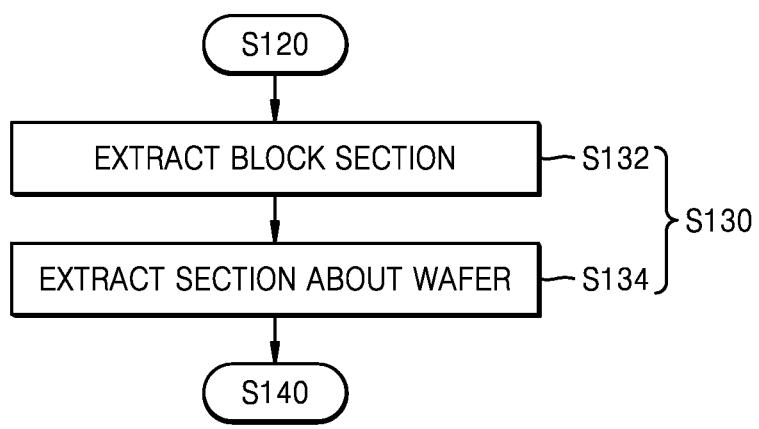
FIGS. 4A and 4B are respectively a flowchart and a graph showing a detailed process of wafer section extraction in the wafer quality inspection method of FIG. 1 according to an exemplary embodiment of the inventive concept.
Figure 4B:
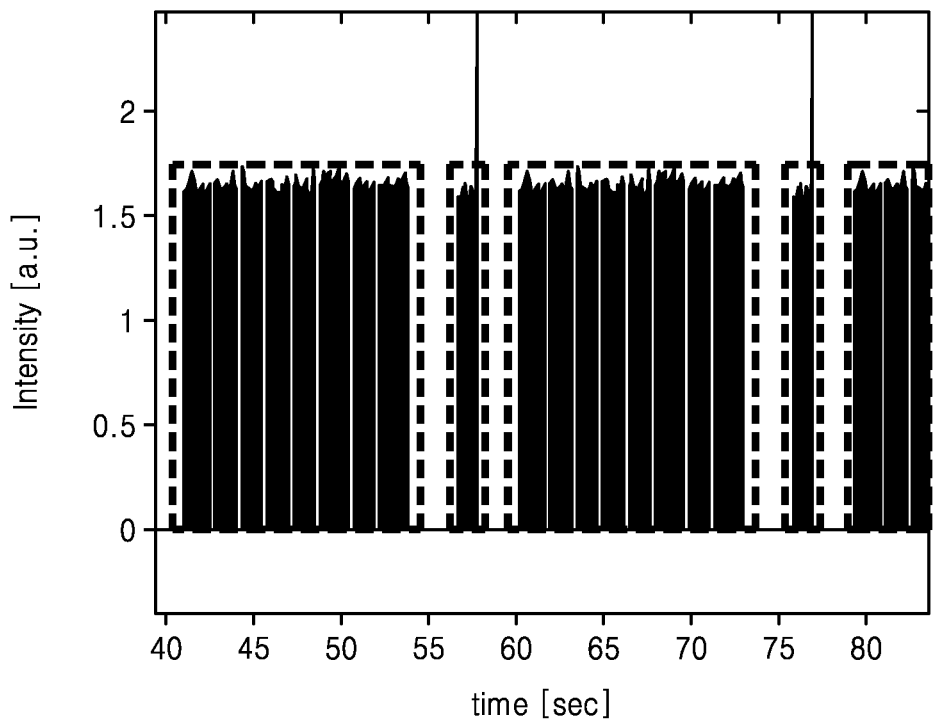

FIGS. 4A and 4B are respectively a flowchart and a graph showing a detailed process of wafer section extraction in the wafer quality inspection method of FIG. 1 according to an exemplary embodiment of the inventive concept. In the graph, the x-axis denotes a process time, the y-axis denotes an intensity of an ion beam, and the unit of the intensity may be an arbitrary unit. Description of the details already provided above with reference to FIG. 1 will be briefly provided or omitted.

Referring to FIGS. 4A and 4B, in a process of extracting a wafer section, first, a block section is extracted (S132). Effective data obtained after removing unsuitable data may include data about the ion beam corresponding to several wafers. In addition, data about the ion beam corresponding to each wafer may be distinguished in block units as marked by dashed squares of FIG. 4B. For reference, in FIG. 4B, broad blocks correspond to data about the ion beam corresponding to an actual wafer, and narrow blocks between the broad blocks may be sections in which the ion beam is radiated without a wafer and may correspond to a scan mode.

In the broad blocks, inner portions are distinguished by a white line, and the number of inner portions may correspond to the number of times that scanning is conducted within one wafer. For example, FIG. 4B illustrates that scanning is conducted eight times on one wafer. This may also indicate that the wafer moved reciprocally four times in a vertical direction via the vertical axis 190 in a corresponding IMP process.

Next, a section about the wafer (e.g., the wafer section) is extracted (S134). Extraction of the wafer section may ultimately refer to extracting sections corresponding to a wafer from the previously extracted block sections, and excluding those blocks which are included in a scan mode but do not correspond to ion implantation into a wafer, for example, blocks having a small width.

Here, extraction of the wafer section may refer to extracting one block corresponding to one wafer, or extracting a plurality of blocks corresponding to all wafers. A block corresponding to one wafer may be used in determining a quality of a corresponding wafer based on a threshold after calculating a feature value. In addition, a plurality of blocks corresponding to all wafers may be used in calculating a dispersity of each of feature values or configuring a database (DB), and thus may be used in diagnosing a state of an equipment used in conducting an IMP process on all corresponding wafers or a state of an ion beam in the equipment.

Figure 5A:
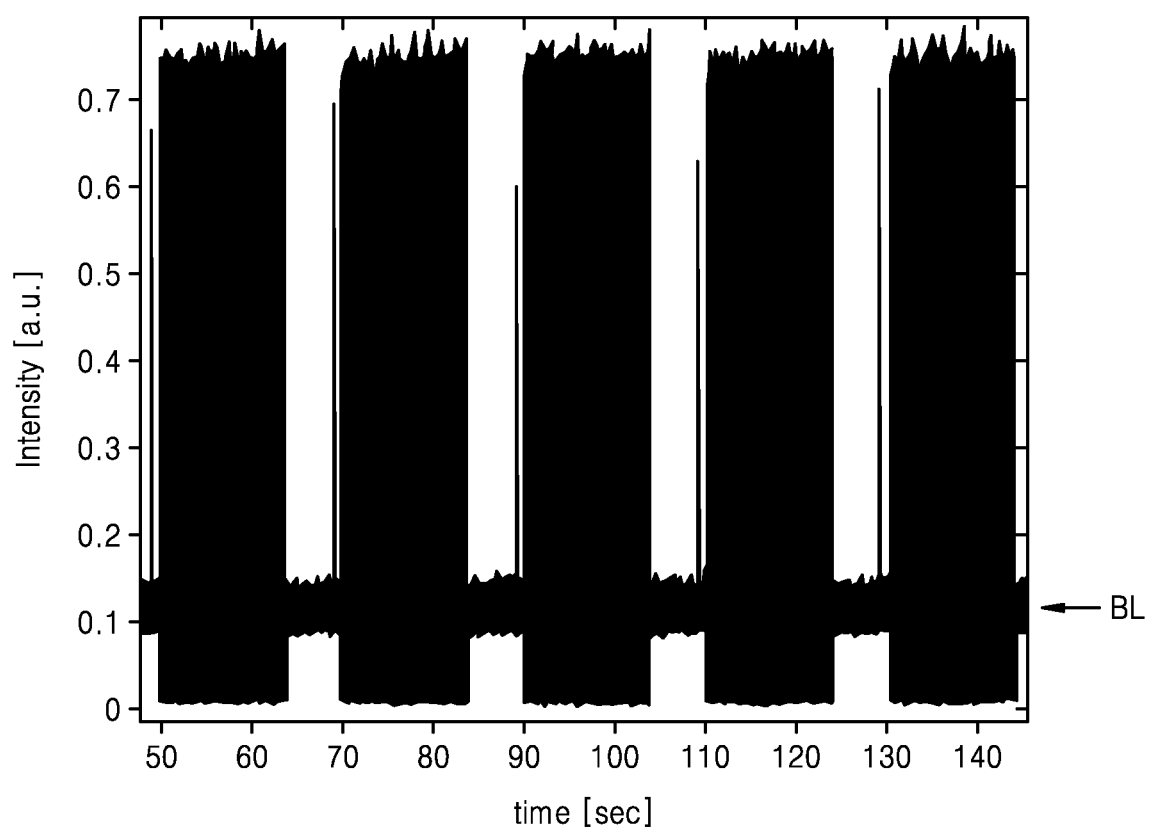
FIGS. 5A and 5B are graphs for showing a reference for normal data and abnormal data of an ion beam in connection with the wafer quality inspection method of FIG. 1 according to an exemplary embodiment of the inventive concept.
Figure 5B:
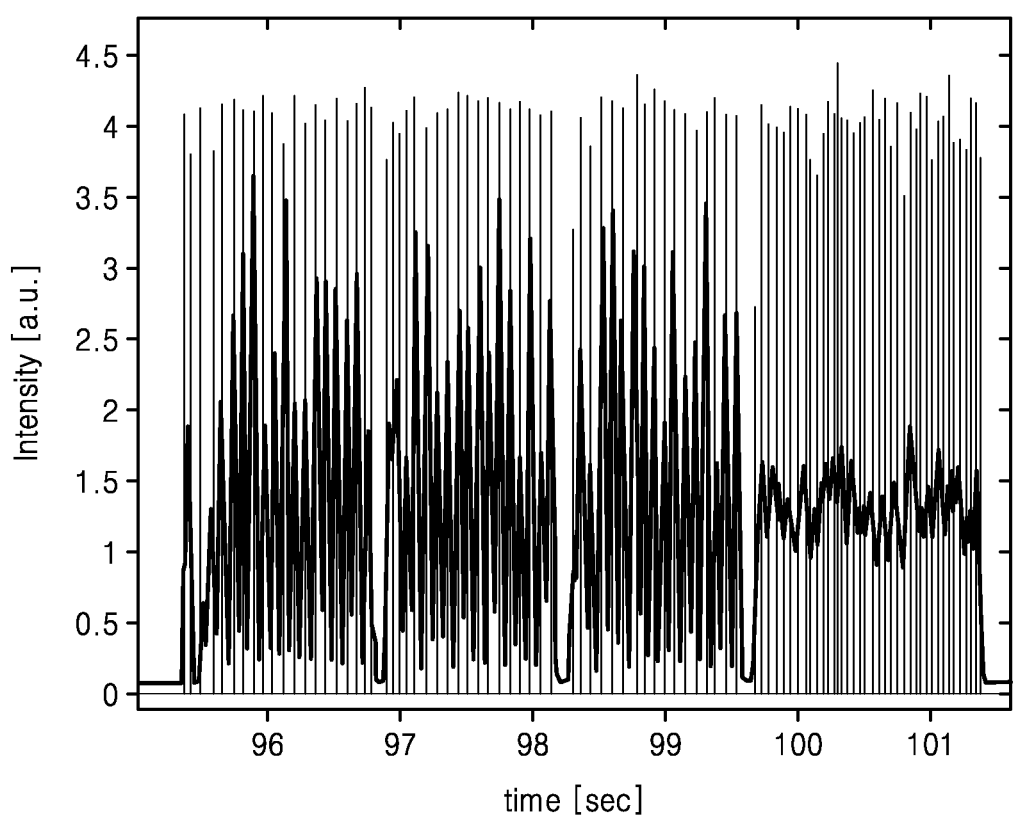

FIGS. 5A and 5B are graphs showing a reference for normal data and abnormal data of an ion beam in connection with the wafer quality inspection method of FIG. 1 according to an exemplary embodiment of the inventive concept. In the graphs, the x-axis denotes process time, the y-axis denotes an intensity of an ion beam, and the unit of the intensity may be an arbitrary unit. Description of details already provided above with reference to FIG. 1 will be briefly provided or omitted.

Referring to the graph of FIG. 5A, a base line noise abnormality is shown in data of an ion beam. For example, in data of a normal ion beam, a base line BL is to be formed at 0. However, in the graph of FIG. 5A, a base line BL is formed at 0.1. This may occur due to an increase in a DC offset value resulting from internal noise that is caused in hardware or software of the dose controller 150 (see FIG. 2B). A base line BL that is greater than 0 may obstruct a desired level of ion implantation into a wafer in an IMP process. For example, an intensity of an ion beam injected into a wafer may be greater than a normal value, and this may cause a poor wafer quality.

The graph of FIG. 5B shows data about an ion beam corresponding to four scans with respect to one wafer, showing defective ion beam patterns. For example, an ion beam intensity should be maintained uniformly to some extent during scanning, but due to some factors, the ion beam intensity is not uniformly maintained but fluctuates as shown in the graph of FIG. 5B. In the graph of FIG. 5B, a thin straight line denotes raw data with respect to an ion beam intensity, and a dark-colored portion denotes variance calculated based on the raw data.

In an IMP process, data of an ion beam may have various normal or abnormal states. For example, as illustrated in FIGS. 5A and 5B, abnormal states such as base line noise abnormality or irregular beam patterns may exist. In addition, other various abnormal states such as overdose or underdose may exist. In an IMP process, due to several tens of recipes and multiple normal or abnormal states, it may be difficult to set a uniform standard regarding the normal or abnormal states of data of an ion beam. As such, according to the wafer quality inspection method of the present exemplary embodiment, from data of an ion beam corresponding to one wafer, e.g., a wafer section, various feature values are calculated, and a quality of the wafer may be evaluated or a state of equipment may be diagnosed by using the feature values.

Figure 6A:
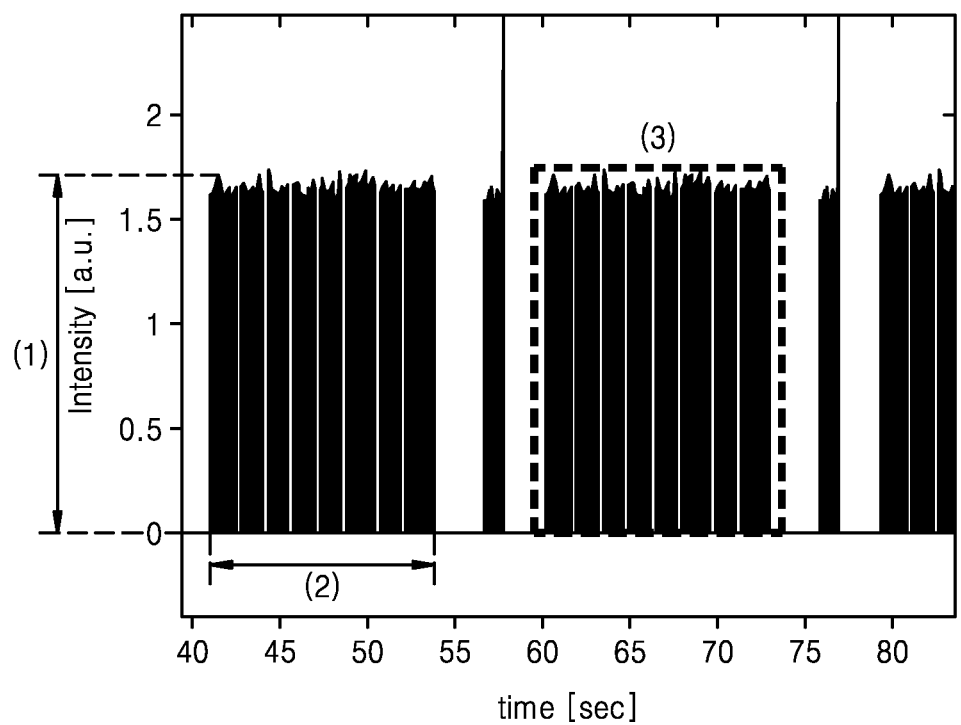
FIGS. 6A and 6B are graphs for describing a process of calculating a feature value with respect to a wafer in the wafer quality inspection method of FIG. 1 according to an exemplary embodiment of the inventive concept.
Figure 6B:
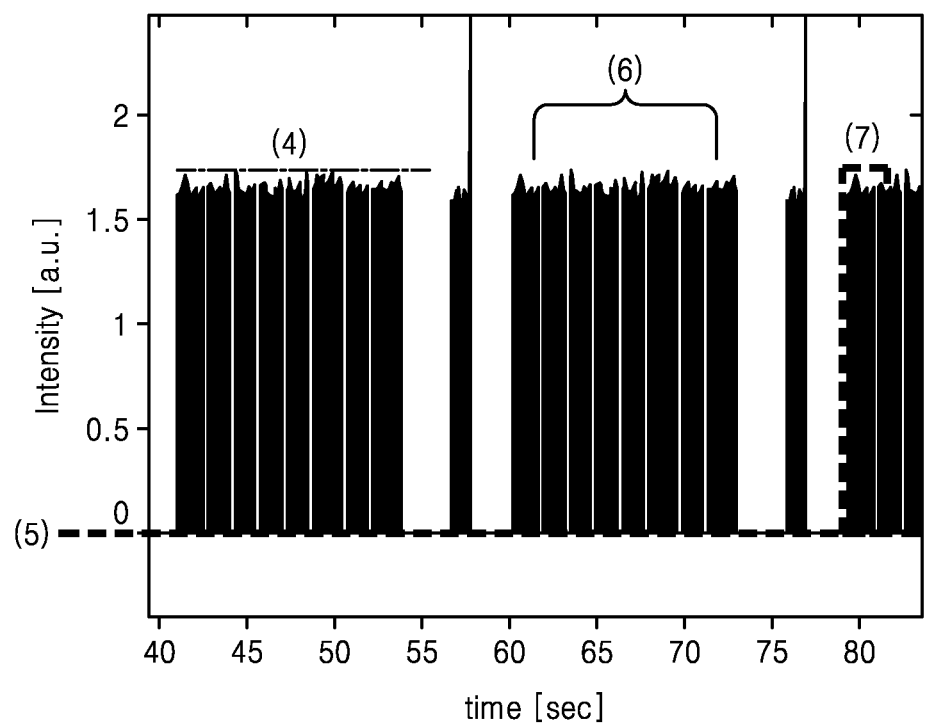

FIGS. 6A and 6B are graphs for describing a process of calculating a feature value with respect to a wafer in the wafer quality inspection method of FIG. 1 according to an exemplary embodiment of the inventive concept. In the graphs, the x-axis denotes process time, the y-axis denotes an intensity of an ion beam, and the unit of the intensity may be an arbitrary unit. Description of the details already provided above with reference to FIG. 1 will be briefly provided or omitted.

Referring to FIGS. 6A and 6B, feature values as follows may be calculated from a block corresponding to one wafer, e.g., a wafer section. First, as marked by a two-way arrow in a y-axis direction on the left side of FIG. 6A, an intensity (1) of an ion beam may be calculated. Secondly, as marked by a two-way arrow in an x-axis direction on the lower left of FIG. 6A, a width (2) of a block may be calculated. Here, a block width may refer to a period of an ion implantation process on one wafer. Thirdly, as marked by a dashed square box in a middle portion of FIG. 6A, a total ion beam intensity (3) may be calculated. The total ion beam intensity may ultimately correspond to a total amount of an ion beam input to one wafer.

Fourth, as marked by a long dashed-short-dashed line on the upper left of FIG. 6B, a uniformity (4) of a top line of a block may be calculated. A uniformity of a top line may indicate a uniformity of an ion beam intensity. Fifth, as marked by a thick dashed line in the lower portion of FIG. 6B, a level (5) of a base line of a block may be calculated. The base line may correspond to, for example, an intensity of noise. Sixth, as marked in the upper middle portion of FIG. 6B, the number of scans (6) in a block may be calculated. In FIG. 6B, the number of scans may be eight. Seventh, as marked in the right portion of FIG. 6B, a total ion beam intensity (7) per unit time may be calculated. The total ion beam intensity per unit time may correspond to an instantaneous amount of ion beam input into a wafer.

While calculation of seven kinds of feature values in a wafer section in connection with data of an ion beam is described above, the feature values are not limited to the above-described seven kinds. For example, according to the equipment of the IMP process and/or recipes, less than seven kinds or more than seven kinds of feature values may also be calculated.

After calculating feature values from a wafer section, a quality of a wafer may be inspected by using the feature values. For example, with respect to each of the feature values, a threshold and/or a normal range may be set, and by comparing the threshold and/or the normal range with feature values calculated from the wafer, a quality of the wafer may be evaluated. In addition, feature values of a plurality of wafers may be configured as a DB, and a quality of wafers may be evaluated through deep learning or machine learning based on the DB.

Furthermore, feature values may be extracted according to products, process recipes, and process equipment groups and configured as a DB, and the feature values according to products, process recipes, and process equipment groups may be compared and analyzed with respect to one another to evaluate the quality of the wafers. In other words, wafers may be subsequently formed into different semiconductor products, the IMP process may be performed using different process recipes, and/or different process equipment groups may be used to perform the IMP process. Therefore, extracted feature values may be grouped according to different combinations of the products, process recipes, and process equipment groups. These feature values may thus be compared and analyzed to determine the quality of the wafers across the different combinations.

Evaluation of a quality of wafers through DB configuration and deep learning or machine learning based on the DB will be described in detail with reference to FIG. 8.

Figure 7:
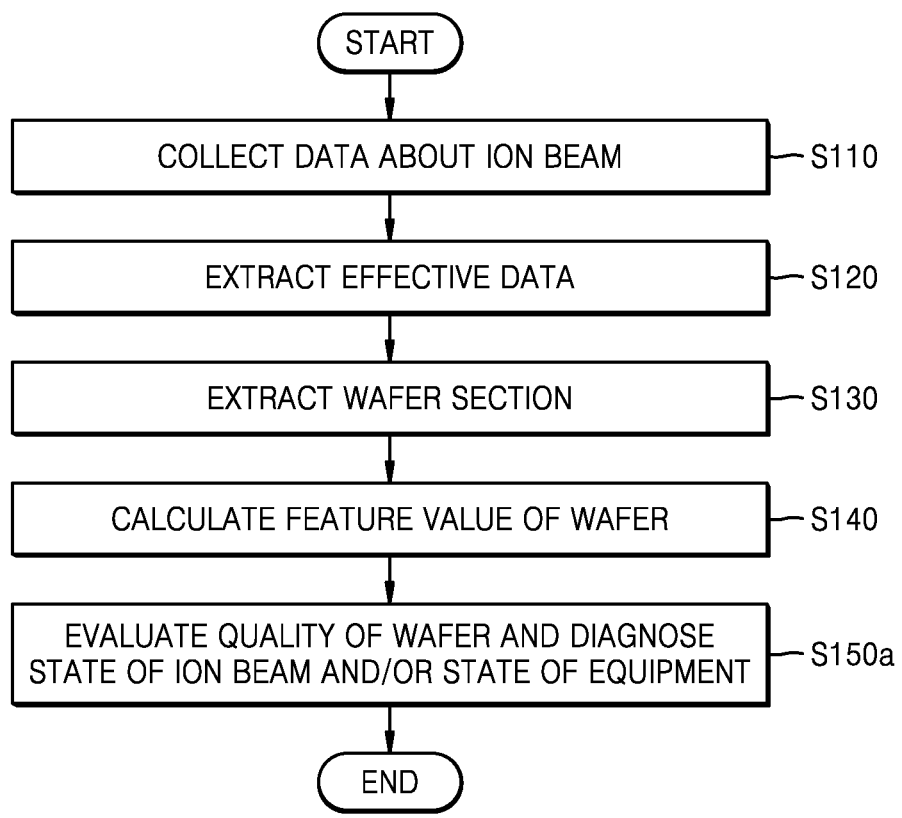
FIGS. 7 through 9 are schematic flowcharts of a wafer quality inspection method according to exemplary embodiments of the inventive concept.
Figure 8:
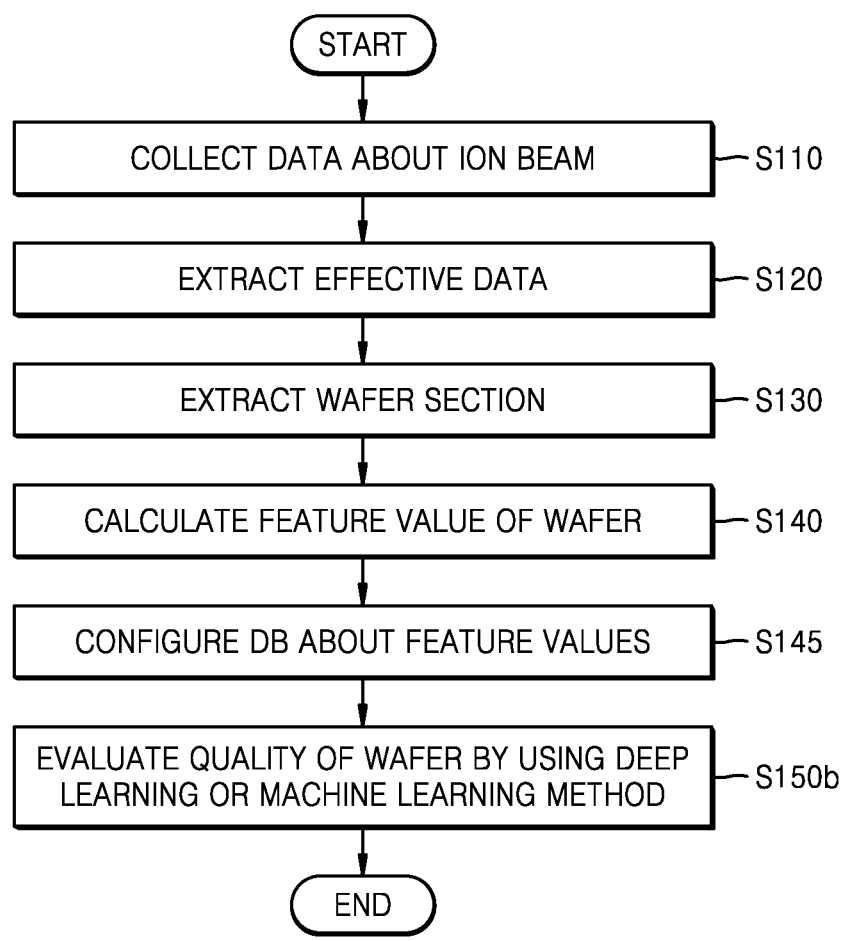
Figure 9:
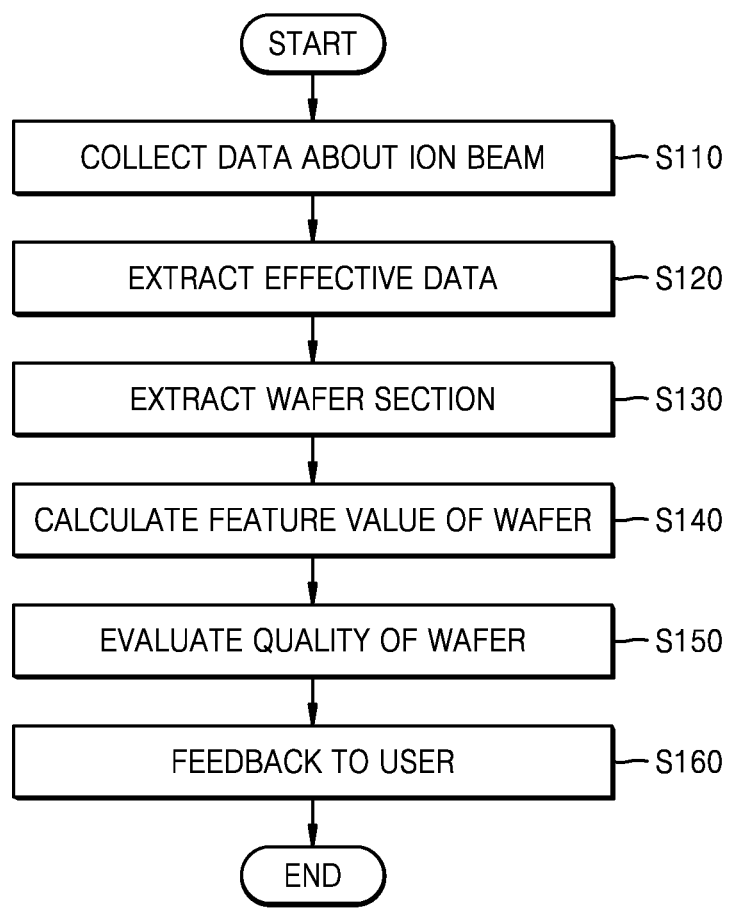

FIGS. 7 through 9 are schematic flowcharts of a wafer quality inspection method according to exemplary embodiments of the inventive concept. Description of the details already provided above with reference to FIGS. 1 through 6B will be briefly provided or omitted.

Referring to FIG. 7, the wafer quality inspection method according to the present exemplary embodiment may be different from the wafer quality inspection method of FIG. 1, e.g., an operation S150a of evaluating a wafer quality. In detail, according to the wafer quality inspection method of the present exemplary embodiment, first, operations from operation S110 of collecting data about an ion beam to operation S140 of calculating a feature value about a wafer are performed. Operation S110 of collecting data about the ion beam to operation S140 of calculating the feature value about the wafer are as described above with reference to FIGS. 1 through 6B.

Next, evaluation of a wafer quality and diagnosis of a state of an ion beam and/or diagnosis of a state of equipment are performed (S150a). For example, according to the wafer quality inspection method of the present exemplary embodiment, after operation S140 of calculating the feature value of the wafer, not only evaluation of wafer quality but diagnosis of an ion beam state and/or diagnosis of a state of equipment may also be performed.

Diagnosis of an ion beam state and/or diagnosis of a state of equipment may be performed based on wafer quality evaluation. In general, when an equipment performing an IMP process and/or an ion beam are in a poor state, wafers on which an IMP process is performed by using that equipment and/or that ion beam are all highly likely to be defective. For example, a wafer may be determined as defective or abnormal by comparing the feature value of the wafer with a predetermined threshold or range. Thus, when a quality of multiple wafers is evaluated as defective (e.g., when a number of wafers determined as abnormal exceeds a predetermined minimum), the state of the equipment of the IMP process and/or the state of the ion beam may also be diagnosed as defective. In addition, a dispersity of each of feature values of wafers may be calculated according to each IMP process equipment, and a state of equipment and/or a state of an ion beam may be determined based on the calculated dispersity.

Diagnosis of an ion beam state and/or diagnosis of a state of equipment may also be performed based on a feature value regardless of wafer quality evaluation. In detail, some feature values, for example, a uniformity of a top line of a block and a base line of a block, may be directly associated with the state of an ion beam and/or the state of the equipment. Accordingly, a state of an ion beam and/or a state of equipment may be diagnosed based on a uniformity of a top line of a block and a base line of the block. In addition to the illustrated feature values, additional feature values may be newly calculated for diagnosis of a state of an ion beam and/or a state of equipment. Rather than diagnosing based on feature values of one wafer or wafer quality evaluation of the one wafer, diagnosis of a state of an ion beam and/or a state of equipment may be performed based on feature values of multiple wafers and quality evaluation thereof.

Therefore, by diagnosing the ion beam state and/or the state of equipment according to the above-described method, for example, a configuration of the equipment may be adjusted or the equipment may be modified or replaced. Accordingly, quality of wafers may be accurately evaluated, thus expediting the semiconductor device manufacturing process.

Referring to FIG. 8, the wafer quality inspection method according to the present exemplary embodiment may be different from the wafer quality inspection method of FIG. 1, e.g., an operation S145 of configuring a DB and operation S150b of evaluating a wafer quality. According to the wafer quality inspection method of the present exemplary embodiment, first, operations from operation S110 of collecting data about an ion beam to operation S140 of calculating a feature value about a wafer are performed, and the operations are respectively the same as those described above with reference to FIGS. 1 through 6B.

Furthermore, a DB about feature values according to products, process recipes, and process equipment groups may be configured (S145). In other words, feature values may be calculated with respect to multiple wafers according to products, process recipes, and process equipment groups, and then the DB may be configured with respect to each of the feature values. For example, seven kinds of feature values may be extracted with respect to all wafers on which an IMP process is performed using equipment A; seven kinds of feature values may be extracted with respect to all wafers on which an IMP process is performed using equipment B; and seven kinds of feature values may be extracted with respect to all wafers on which an IMP process is performed using equipment C. Next, a DB of the feature values with respect to each equipment may be configured.

After configuring the DB, quality of wafers is evaluated by using a deep learning method or a machine learning method based on the DB (S150b). Machine learning is one of the methods for implementing artificial intelligence (AI), and deep learning may be one field of machine learning. In machine learning, humans may first process a given material. For example, a human may process images by classifying them so that a computer may recognize them, and then the computer may analyze and accumulate features included in images, and finally the computer may determine an answer by summing up the features of the images based on the accumulated data. On the other hand, jobs done by a human may be omitted in deep learning. For example, when background data is input without any change, a computer may analyze the data through algorithms such as a convolutional neural network (CNN), a recurrent neural network (RNN), a deep Q-Network, or the like, and work out an answer. For example, CNN is a type of an artificial neural network used in the field of image processing or computer vision, and relates to, for example, understanding images and extracting highly abstract information from the images or drawing a picture of a new texture.

In an example using a supervised machine learning classifier (such as naïve Bayes), an initial data set for a plurality of wafers and their respective feature values (e.g., the above-described seven in FIGS. 6A and 6B) may be prepared. The initial data set may be labeled, e.g., by a human, so that each of the plurality of wafers is marked as normal or abnormal. The initial data set may be split into a training set and a test set, and the machine learning classifier is fit according to the training set. Subsequently, the accuracy of the classifier may be evaluated by feeding the test set into the classifier. If the accuracy is sufficient (e.g., higher than a predetermined threshold), the classifier may then be used for any new data on wafers with calculated feature values to determine the quality thereof (e.g., normal or abnormal).

As described above, the wafer and feature value data may be stored in the DB. By evaluating a wafer quality through DB configuration and a deep learning method or a machine learning method based on the DB, the accuracy and speed of wafer quality evaluation may be increased, in comparison to other methods. In addition, operations from operation S110 of collecting data about an ion beam to operation S145 of configuring a DB may be performed in real time on all wafers, and the DB may be updated in real time in operation S145 of configuring the DB, thus further increasing an accuracy of wafer quality evaluation through the deep learning method or the machine learning method. As such, a semiconductor device manufacturing process including the above-described wafer quality inspection method may be improved.

Meanwhile, not only wafer quality evaluation but diagnosis of a state of equipment and/or a state of an ion beam may also be performed through the DB configuration and the deep learning method or the machine learning method. In addition, DB configuration may be implemented according products, process recipes, and process equipment groups as described above, and the deep learning method or the machine learning method may be performed according to the products, process recipes, and process equipment groups. Accordingly, a state of equipment and/or a state of an ion beam may be diagnosed according to the products, process recipes, and process equipment groups.

Referring to FIG. 9, the wafer quality inspection method according to the present exemplary embodiment may be different from the wafer quality inspection method of FIG. 1, e.g., an operation S160 of sending feedback to a user is further included. According to the wafer quality inspection method of the present exemplary embodiment, operations from operation S110 of collecting data about an ion beam to operation S150 of evaluating a wafer quality are performed, and the operations are respectively the same as those described above with reference to FIGS. 1 through 6B.

Next, a result of wafer quality inspection is fed back to the user (S160). Feedback may be sent to the user by using various methods. For example, in a first method, a wafer quality inspection result may be fed back to the user via at least one of email, a social networking service (SNS), a light-emitting diode (LED), a display, a buzzer, or an equipment interlock. In addition, in a second method, a wafer quality inspection result may be fed back by a user monitoring the wafer quality inspection result in real time and online through at least one of a personal computer (PC) or a mobile device. In other words, the wafer quality inspection result may be provided online in real time and the user may monitor the result at any time. The mobile device may refer to a compact electronic device, for example, a smartphone or a tablet PC, which may be carried by a person on the go. Furthermore, in a third method, a result of wafer quality evaluation may be sent to a user as feedback as a report sent per period (e.g., a predetermined period such as once an hour, once a day, once a week, etc.) through at least one of a PC or a mobile device. In other words, feedback may be provided to the user through at least one of the first method, the second method, or the third method.

Only feedback of wafer quality evaluation is described above, but information being fed back is not limited to results of wafer quality evaluation. For example, a result of diagnosis of a state of equipment and/or a state of an ion beam described with reference to FIG. 7 may also be fed back to a user by using the above-described various methods. In addition, a result of wafer quality evaluation and a result of diagnosis of a state of equipment and/or a state of an ion beam through DB configuration and the deep learning method or the machine learning method based on the DB configuration described with reference to FIG. 8 may also be fed back to a user.

The user may know the results of wafer quality evaluation, diagnosis of a state of equipment, and/or a state of an ion beam in real time through the feedback process as described above. Thus, when an abnormality occurs, the cause may be analyzed to take prompt action, thus preventing massive loss such as a large number of defective wafers.

Figure 10A:
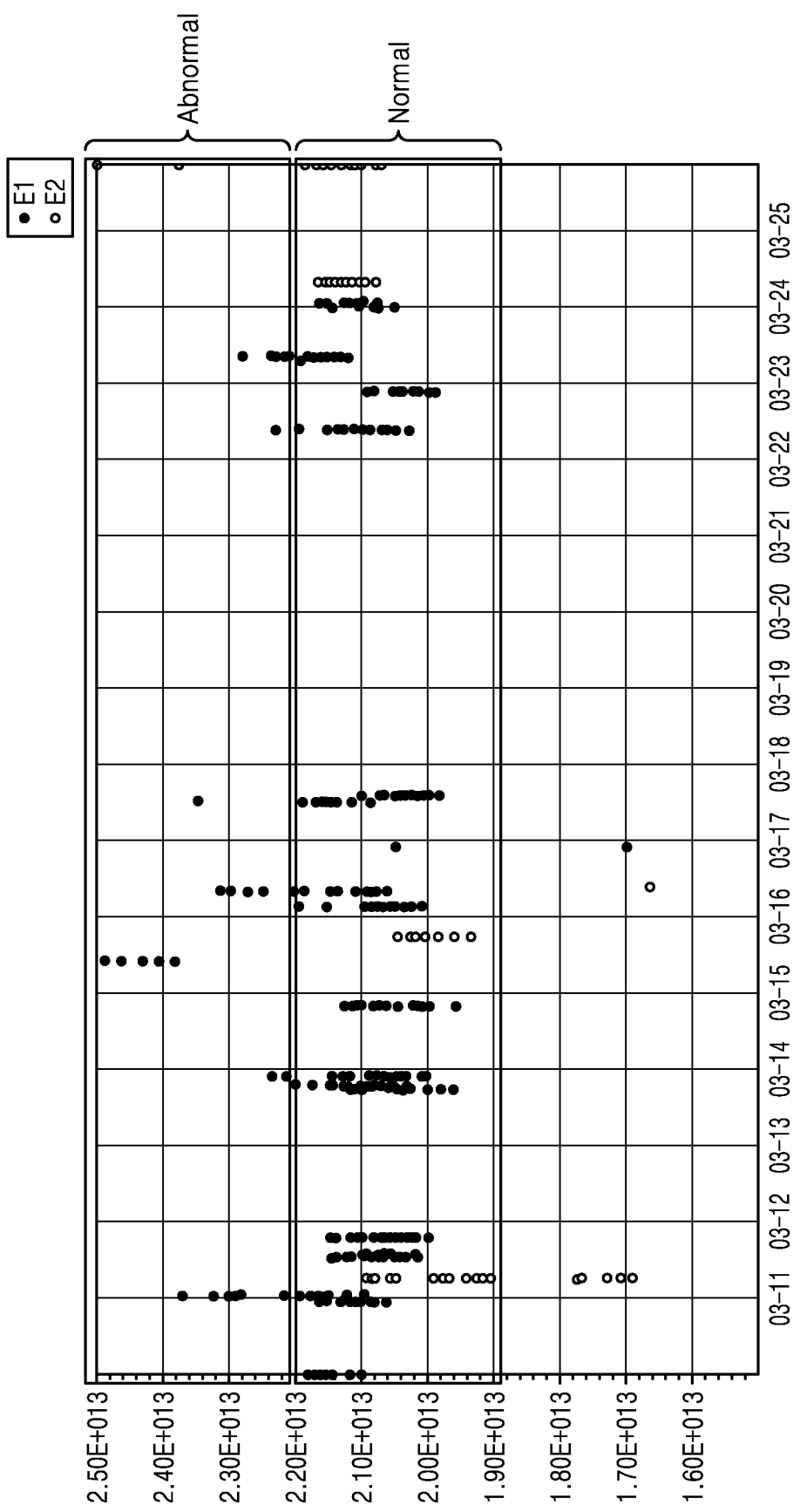
FIGS. 10A through 10C are graphs for describing a user feedback process in the wafer quality inspection method of FIG. 9 according to an exemplary embodiment of the inventive concept.
Figure 10B:
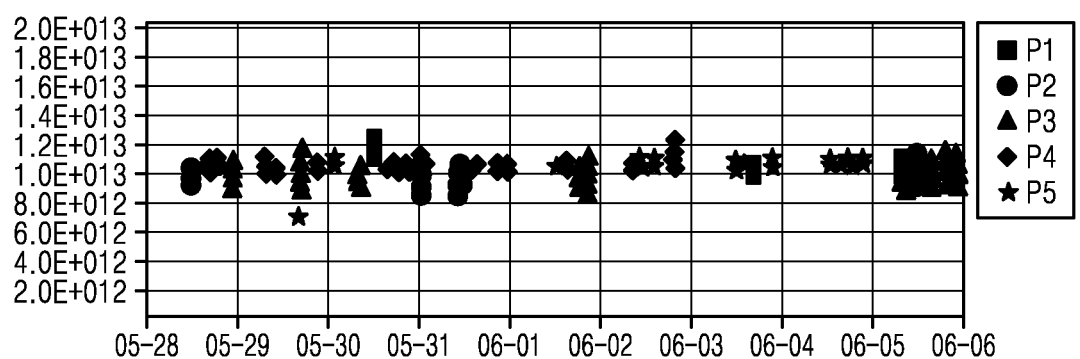
Figure 10C:
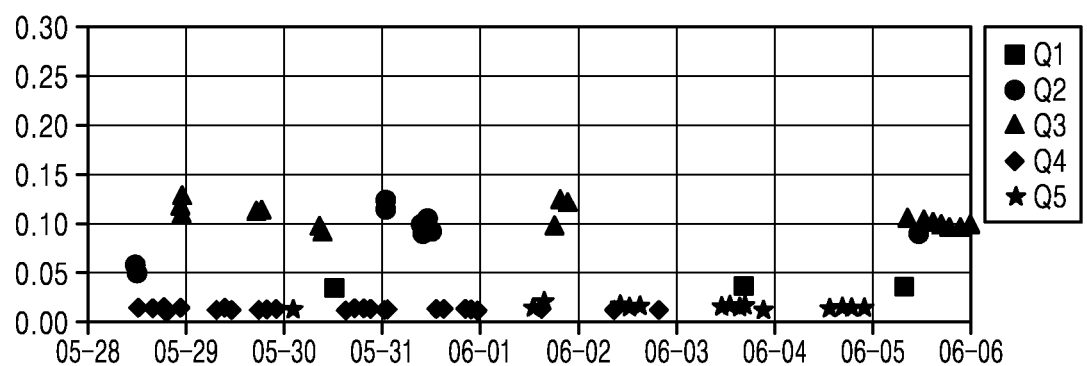

FIGS. 10A through 10C are graphs for describing a user feedback process in the wafer quality inspection method of FIG. 9 according to an exemplary embodiment of the inventive concept. In the graphs of FIGS. 10A and 10B, the x-axis may denote date and the y-axis may denote a dose injected into a wafer, and in the graph of FIG. 10C, the x-axis may denote date and the y-axis may denote an ion beam intensity. In addition, E1, E2, P1 through P5, and Q1 through Q5 may denote doses of wafers on which an IMP process is performed using corresponding equipment, an average dose, or a base line. For example, in FIG. 10A, ● may indicate a dose of wafers on which an IMP process is performed using equipment E1.

Referring to FIG. 10A, wafers of a dose in a section marked as normal may be normal, and wafers of a dose in a section marked as abnormal may correspond to abnormal wafers, e.g., defective wafers. It is apparent from FIG. 10A that a large number of defects occur in wafers on which an IMP process is performed using equipment E1. As described above, a result of evaluation of wafers on which an IMP process is performed may be shown as graphs according to equipment, and the result may be identified by a user through a search on a PC or a mobile device. Meanwhile, results of wafer evaluation may be classified not only according to pieces of equipment but also process recipes, products, or the like, and shown as graphs, and the user may check the results in real time through a web search.

Referring to FIG. 10B, an average dose of wafers according to each equipment is shown. As the average dose of wafers is displayed according to each equipment, a tendency of each equipment according to date may be determined. Data about an average dose of wafers according to pieces of equipment may be reported as graphs in predetermined cycles, for example, every ten days. However, the shape of data is not limited to graphs. The reporting period is also not limited to ten days. Periodic data reports allow a user to check a tendency in a dose of wafers of corresponding equipment and a state of each equipment according to the dose tendency.

Referring to FIG. 10C, base lines of wafers according to pieces of equipment are shown, and here, not a base line of each wafer but an average base line of the wafers is shown. Similar to FIG. 10B, periodic data reports allow a user to check a tendency in a base line of wafers of corresponding equipment and a state of each equipment according to the base line tendency. For example, in FIG. 10C, base lines of pieces of equipment Q4 and Q5 are close to 0, and thus there is no problem. However, base lines of pieces of equipment Q1 through Q3 are 0.05 or more and thus a DC offset defect due to noise may have occurred.

Figure 11:
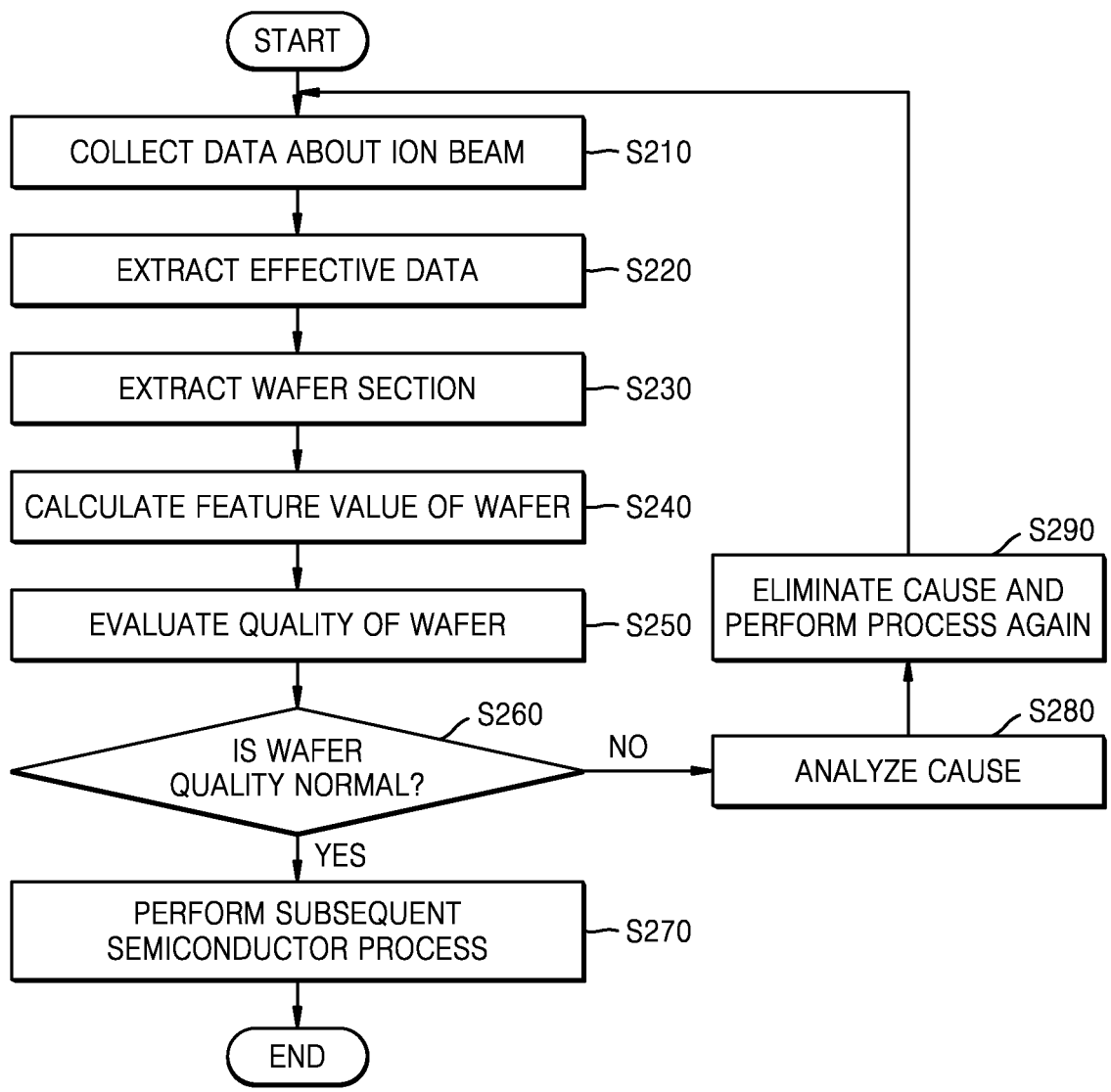
FIG. 11 is a schematic flowchart of a semiconductor device manufacturing method including a wafer quality inspection method, according to an exemplary embodiment of the inventive concept.

FIG. 11 is a schematic flowchart of a semiconductor device manufacturing method including a wafer quality inspection method according to an exemplary embodiment of the inventive concept. Description of the details already provided above with reference to FIGS. 1 through 9 will be briefly provided or omitted.

Referring to FIG. 11, according to the semiconductor device manufacturing method of the present exemplary embodiment, first, operations from operation S210 of collecting data about an ion beam to operation S250 of evaluating a wafer quality are performed. Operation S210 to operation S250 may be substantially the same as operation S110 to operation S150 as described with reference to FIGS. 1 through 6B.

Next, it may be determined whether a wafer quality is normal (S260). In other words, certain criteria, for example, a threshold or a normal range, are used to determine whether a wafer quality is normal or abnormal. For example, the wafer quality may be determined as normal by comparing the calculated feature value with a predetermined threshold or range.

When a wafer quality is determined to be normal (S260: Yes), a semiconductor process is performed on the wafer (S270). A semiconductor process on a wafer may include various processes. For example, the semiconductor process on a wafer may include a deposition operation, an etching operation, an ion operation, a washing operation, or the like. By performing a semiconductor process on a wafer, integrated circuits and wirings needed for a corresponding semiconductor device may be formed. The semiconductor process on the wafer may include a test process on the semiconductor device at a wafer level. When the semiconductor process on the wafer is an ion process, a wafer quality may be evaluated again by using the above-described method.

When semiconductor chips are completed in a wafer through the semiconductor process on the wafer, the wafer may be individualized or separated into individual semiconductor chips. Individualization into semiconductor chips may be performed using a sawing process with a blade or laser. Next, a packaging process may be performed on the semiconductor chips. The packaging process may refer to an operation of mounting semiconductor chips on a printed circuit board (PCB) and encapsulating the semiconductor chips by using an encapsulation material. The packaging process may include stacking multiple semiconductors on the PCB in multiple layers to form a stack package or stacking a stack package on another stack package to form a package on package (POP) structure. A semiconductor device or a semiconductor package may be completed through the packaging process of semiconductor chips. After the packaging process, a test process may be performed on the semiconductor package.

Meanwhile, in operation S260 of determining whether a wafer quality is normal, when a wafer quality is determined to be abnormal (S260: No), the cause is analyzed (S280). Next, the cause may be eliminated, and a corresponding process is performed again on a new wafer (S290). Elimination of the cause may be performed by, for example, modifying process conditions. After performing the process again, operation S210 of collecting data about the ion beam may be performed. Additionally, when the cause is unknown, by repeatedly modifying the process conditions and performing the process again from operation S210 of collecting data about the ion beam through operation S250 of evaluating the wafer quality, wafer quality defects may be gradually reduced.

Meanwhile, in the semiconductor device manufacturing method according to the present exemplary embodiment, operation S250 of evaluating a wafer quality may include, as described above with reference to FIGS. 7 through 9, diagnosis of a state of an ion beam and/or a state of equipment or DB configuration and wafer quality evaluation through deep learning or machine learning based on the DB. In addition, in operation S260 of determining whether a wafer quality is normal, whether an ion beam state and/or a state of equipment is normal may also be determined.

Figure 12A:
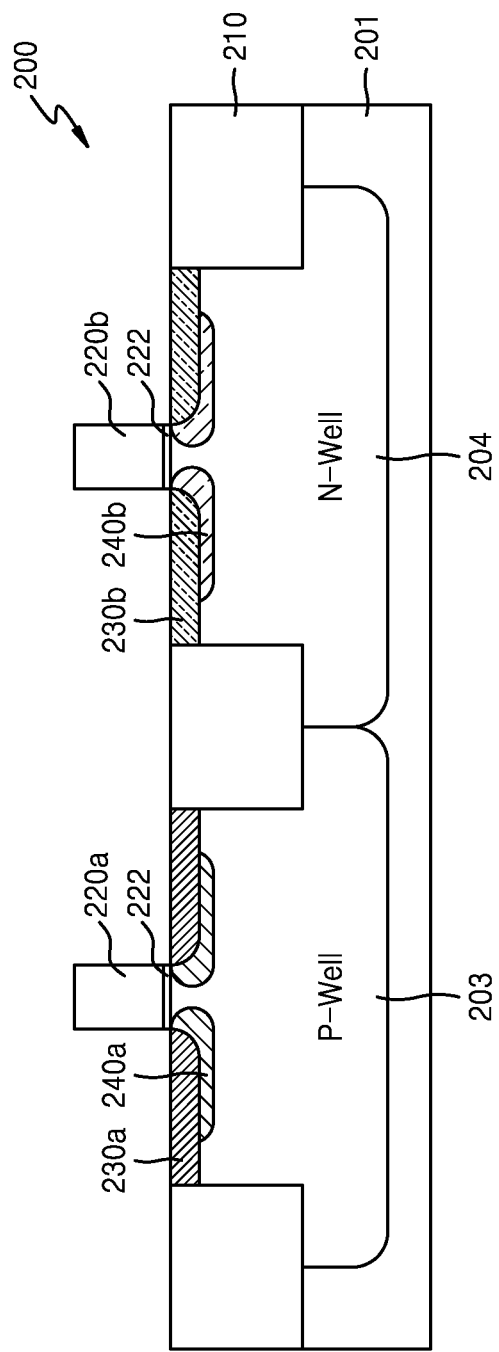
FIGS. 12A and 12B are respectively a cross-sectional view of a semiconductor device on which an ion implantation (IMP) process is performed, and discovery of an abnormality and remedy of the abnormality, in connection with the semiconductor device manufacturing method of FIG. 11 according to an exemplary embodiment of the inventive concept.
Figure 12B:
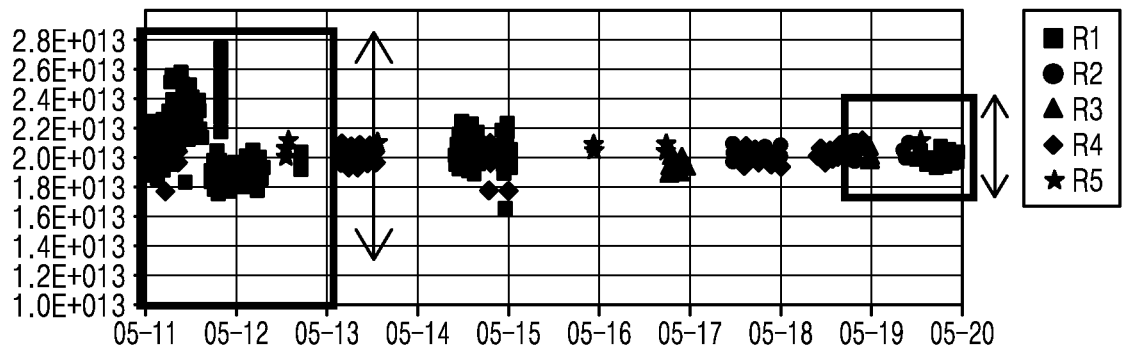

FIGS. 12A and 12B are respectively a cross-sectional view of a semiconductor device on which an IMP process is performed and a graph for explaining discovery of an abnormality and remedy of the abnormality, in connection with the semiconductor device manufacturing method of FIG. 11 according to an exemplary embodiment of the inventive concept. In the graph, the x-axis may denote date and the y-axis may denote a dose injected into a wafer. In addition, R1 through R5 may indicate a dose of wafers on which an IMP process is performed in corresponding equipment.

Referring to FIG. 12A, when forming a semiconductor device, for example, a transistor, in the wafer 200, as illustrated in the drawing, well regions 203 and 204 such as a P-type well or an N-type well may be formed in a substrate 201 of the wafer 200. Additionally, source/drain regions 230a and 230b, halo regions 240a and 240b, polygates 220a and 220b, a gate insulating layer 222, a shallow trench isolation (STI) 210, or the like may be formed. Here, an IMP process may be performed to form the well regions 203 and 204, the source/drain regions 230a and 230b, and the halo regions 240a and 240b. The halo regions 240a and 240b are formed at a relatively close location from a substrate surface and have a relatively small thickness, and thus an IMP process used to form the halo regions 240a and 240b may require precise control, potentially causing a large number of defects.

The semiconductor device manufacturing method according to the present exemplary embodiment may be performed, as described above, such that data about an ion beam is collected in real time by using a Faraday cup, a feature value about a wafer is extracted from the collected data through several operations, and a quality of the wafer may be evaluated based on the feature value in real time. Thus, when a defect occurs in an IMP process, appropriate action may be taken in real time, thus preventing massive defects of wafers in the IMP process and the entire semiconductor device manufacturing process.

Referring to FIG. 12B, a dose of wafers according to each equipment is shown. For example, a dispersity of a dose of wafers of equipment R1 on the 11th to the 13th of May is relatively high. Data about dispersion defects may be obtained in real time by using the above-described wafer quality inspection method. Thus, by taking action on the equipment on the 15th to the 18th of May, the dispersion of the dose of the wafers may be reduced on the 19th and the 20th of May to be stabilized to some extent.

Figure 13:
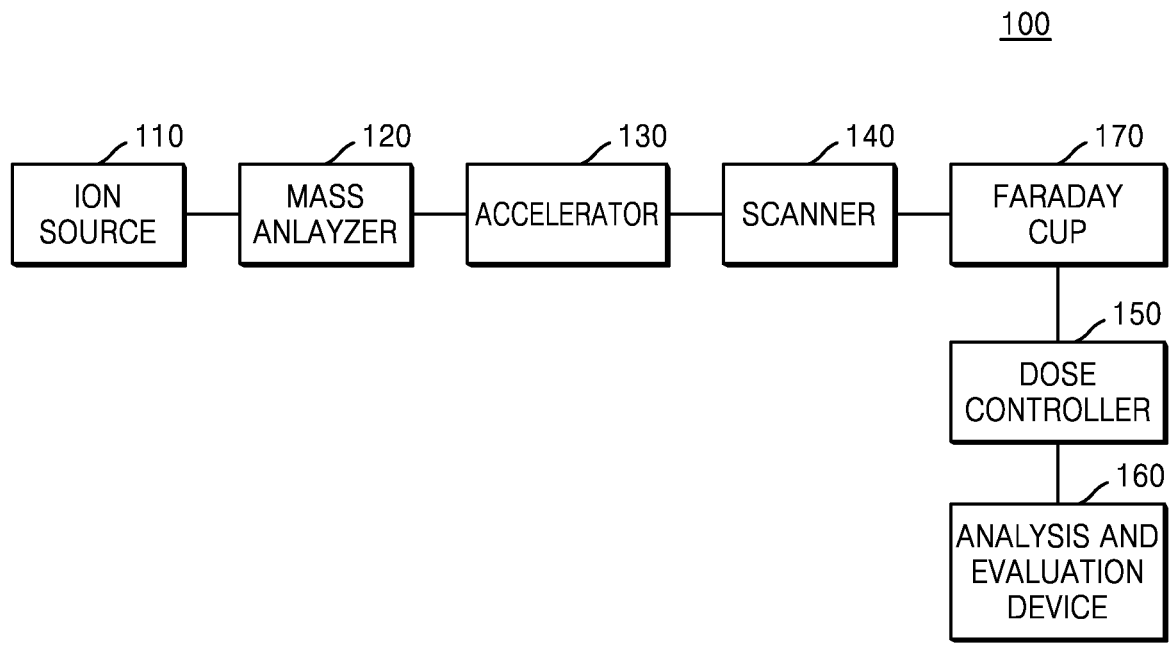
FIG. 13 is a structural block diagram of a wafer quality inspection apparatus according to an exemplary embodiment of the inventive concept.

FIG. 13 is a structural block diagram of a wafer quality inspection apparatus according to an exemplary embodiment of the inventive concept. Description of the details already provided above with reference to FIGS. 1 through 9 will be briefly provided or omitted.

Referring to FIG. 13, the wafer quality inspection apparatus 100 according to the present exemplary embodiment may include an ion source 110, a mass analyzer 120, an accelerator 130, a scanner 140, a dose controller 150, an analysis and evaluation device 160, and a Faraday cup 170.

The ion source 110 may ionize a source material gas and output the ionized gas. The mass analyzer 120 may adjust a magnetic field intensity to select ions to be injected, from among ions from the ion source 110. The accelerator 130 may accelerate the ions to be injected, at a required rate, to form an ion beam. The scanner 140 may align the ion beam into an ion beam of a linear form so that the ion beam is uniformly injected into a wafer. The dose controller 150 may control a total amount of ions injected into a wafer based on data about the ion beam measured by using the Faraday cup 170. The Faraday cup 170 may include, as described with reference to FIGS. 2A through 2C, the main Faraday cup 171, the incident angle Faraday cup 173, the profile Faraday cup 175, and the CLF cup 177, and may measure the ion beam in a setup mode or a scan mode of an IMP process.

The analysis and evaluation device 160 may analyze and evaluate a wafer quality based on data about the ion beam, collected by using the Faraday cup 170 and the dose controller 150. In detail, the analysis and evaluation device 160 may perform extraction of effective data, wafer section extraction, and calculation of feature values of a wafer section from data about an ion beam as described above with reference to FIG. 1, and may also perform evaluation of a wafer quality based on the feature values.

The wafer quality inspection apparatus 100 according to the present exemplary embodiment may obtain data about the ion beam in real time in an IMP process by using the Faraday cup 170 and the dose controller 150, and also may process data about the ion beam by using the analysis and evaluation device 160 to perform quality evaluation on a wafer to increase accuracy of the wafer quality evaluation.

Figure 14A:
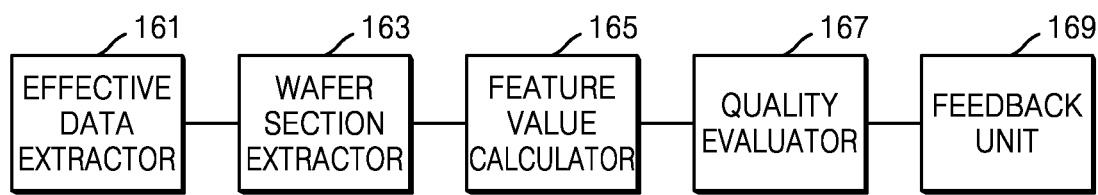
FIGS. 14A through 14C are detailed structural block diagrams of an analysis and evaluation apparatus in the wafer quality inspection apparatus of FIG. 13 according to an exemplary embodiment of the inventive concept.
Figure 14B:
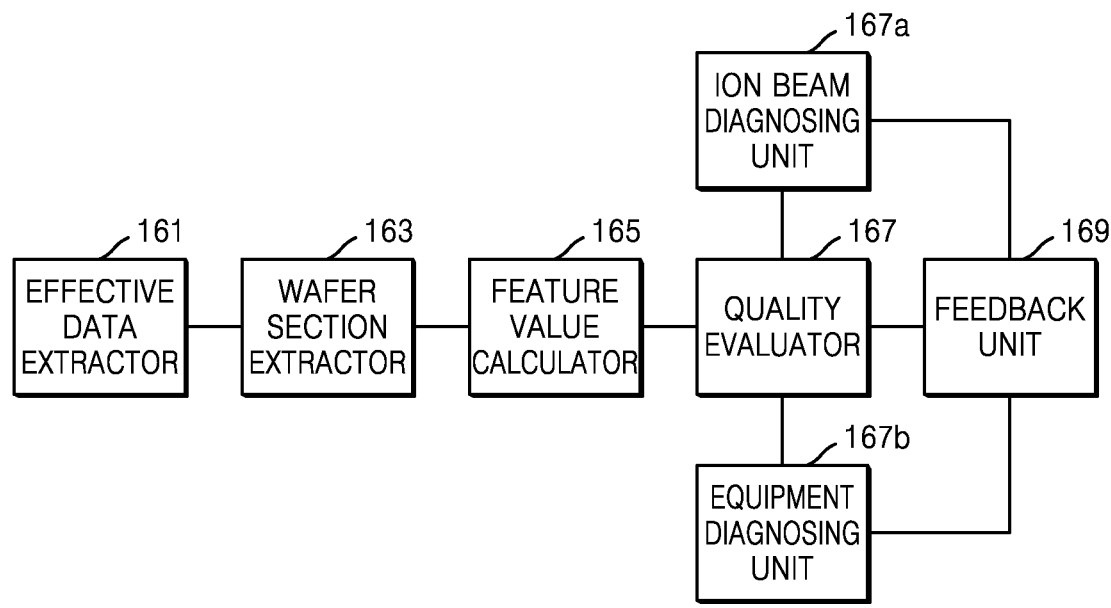
Figure 14C:
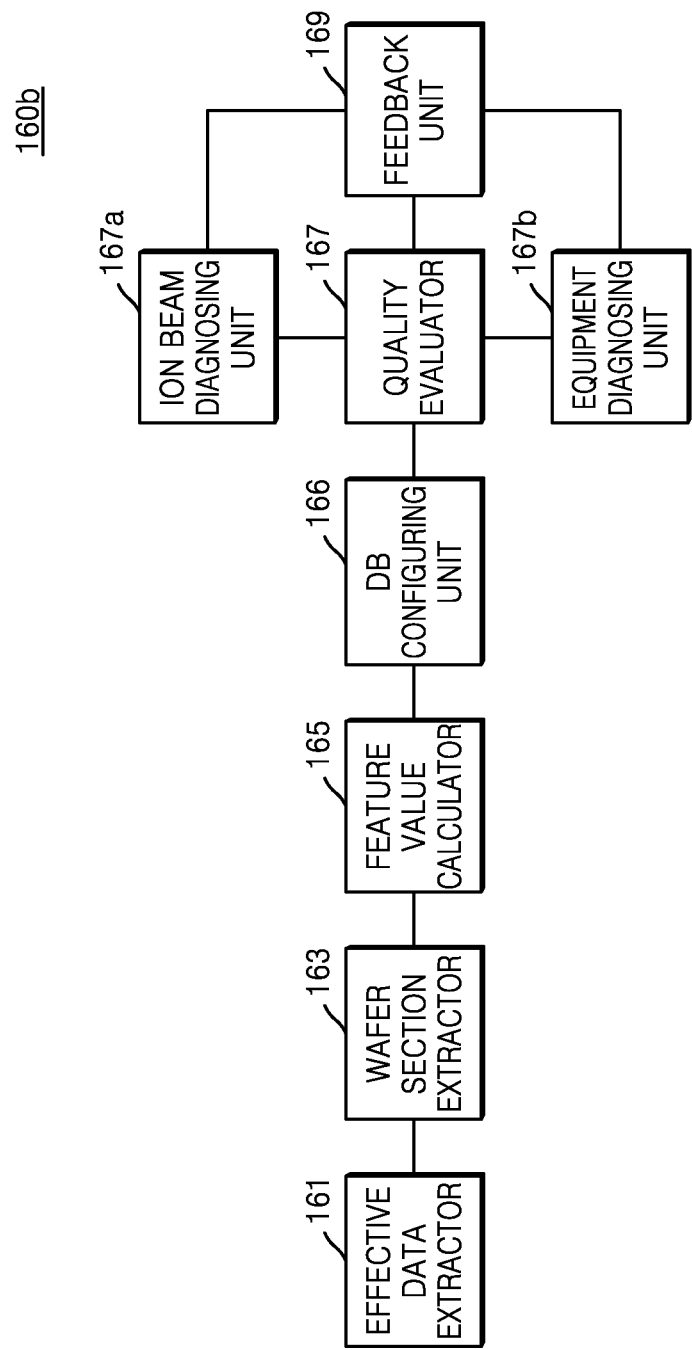

FIGS. 14A through 14C are detailed structural block diagrams of an analysis and evaluation device in the wafer quality inspection apparatus of FIG. 13 according to exemplary embodiments of the inventive concept.

Referring to FIG. 14A, the analysis and evaluation device 160 of the wafer quality inspection apparatus 100 according to the present exemplary embodiment may include an effective data extractor 161, a wafer section extractor 163, a feature value calculator 165, a quality evaluator 167, and a feedback unit 169.

The effective data extractor 161 may remove unsuitable data from data about an ion beam, and extract only data needed in wafer quality evaluation. The wafer section extractor 163 may extract a wafer section, in which ions are actually injected into a wafer, from scan mode sections. The feature value calculator 165 may extract, from data of the ion beam corresponding to one wafer, e.g., a wafer section, feature values that may be a reference for determining a wafer quality. For example, feature values may include, as described above, an ion beam intensity, a width of a block of a wafer section, a total ion beam intensity of a wafer section, a uniformity in a top line of a block, a level of a base line of a block, the number of scanning times in the block, or a total ion beam intensity per unit time. The quality evaluator 167 may evaluate a quality of a wafer based on the calculated feature values. The feedback unit 169 may send feedback on a result of evaluation of wafer quality to a user by using various methods. For example, the feedback unit 169 may notify a user of the result of the wafer quality evaluation through at least one of e-mail, SNS, an LED, a display, a buzzer, or an equipment interlock, or report the result of wafer quality evaluation through at least one of a PC or a mobile device per period.

Referring to FIG. 14B, as compared to the analysis and evaluation device 160 of FIG. 14A, an analysis and evaluation device 160*a* may further include an ion beam diagnosing unit 167*a* and an equipment diagnosing unit 167*b*. The ion beam diagnosing unit 167*a* may diagnose a state of the ion beam in the IMP process based on feature values of a wafer. In addition, the ion beam diagnosing unit 167*a* may diagnose a state of the ion beam based on a result of evaluation of the quality evaluator 167. Similar to the ion beam diagnosing unit 167*a*, the equipment diagnosing unit 167*b* may diagnose a state of equipment in the IMP process based on the feature values of the wafer. In addition, the equipment diagnosing unit 167*b* may diagnose a state of equipment based on the result of evaluation of the quality evaluator 167. Meanwhile, the feedback unit 169 may provide as feedback to a user, not only a result of the quality evaluator 167 but also results of the ion beam diagnosing unit 167*a* and the equipment diagnosing unit 167*b*.

Referring to FIG. 14C, as compared with the analysis and evaluation device 160*a* of FIG. 14B, an analysis and evaluation device 160*b* may further include a DB configuring unit 166. The DB configuring unit 166 may configure a DB regarding each of feature values of a plurality of wafers. In addition, the quality evaluator 167, the ion beam diagnosing unit 167*a*, and the equipment diagnosing unit 167*b* may evaluate a wafer quality and diagnose states of the ion beam and equipment by using a deep learning method or a machine learning method based on the DB. Meanwhile, the feedback unit 169 may provide as feedback to the user, results of the quality evaluator 167, the ion beam diagnosing unit 167*a*, and the equipment diagnosing unit 167*b*.

According to exemplary embodiments of the inventive concept, components illustrated in FIGS. 14A to 14C may be implemented as hardware (e.g., circuits), software, or a combination thereof.

Thus, as described above, through the wafer quality inspection method and apparatus and semiconductor device manufacturing method including the wafer quality inspection method according to exemplary embodiments of the inventive concept, a quality of wafers in an ion implantation (IMP) process, a state of an ion beam, and an abnormality of equipment may be accurately inspected. All wafers may be inspected, and this inspection may be performed in real time, in a relatively short amount of time, and in a nondestructive manner.

While the inventive concept has been particularly shown and described with reference to exemplary embodiments thereof, it will be understood by those of ordinary skill in the art that various changes in form and details may be made thereto without departing from the spirit and scope of the inventive concept as set forth by the following claims.

What is claimed is:

1. A method of inspecting a wafer quality, the method comprising:
    injecting ions into a wafer using an ion beam in an ion implantation process;
    collecting data about the ion beam by using a Faraday cup;
    extracting first data from the data about the ion beam, the first data including at least data collected in real-time about a scan mode in which ions are actually injected into the wafer, wherein extracting of the first data comprises:
        removing second data from the data about the ion beam, wherein the second data is different from the first data and unnecessary in determining the wafer quality; and
        performing a preprocess of extracting an outline of the first data of the data about the ion beam after removing the second data;
    extracting a wafer section from the first data;
    calculating a feature value of the wafer from the wafer section; and
    evaluating a quality of the wafer by comparing the feature value with a predetermined threshold or range.

2. The method of claim 1, wherein the extracting of the wafer section comprises:
    extracting block sections from the first data; and
    extracting the wafer section from among the block sections.

3. The method of claim 1, wherein the wafer section corresponds to a section regarding one wafer, and
    the feature value comprises at least one of an ion beam intensity, a block width of the wafer section, a total ion beam intensity of the wafer section, a uniformity of a top line of a block, a level of a base line of the block, a number of scanning times in the block, or a total ion beam intensity per unit time.

4. The method of claim 1, wherein, in the evaluating of the quality of the wafer, the quality of the wafer is evaluated by using a dispersity, a threshold, or a normal range of the feature value.

5. The method of claim 1, further comprising configuring a database (DB) regarding the feature value, after calculating the feature value.

6. The method of claim 5, wherein, in the evaluating of the quality of the wafer, the quality of the wafer is evaluated by using a deep learning method or a machine learning method based on the DB.

7. The method of claim 1, wherein, in the evaluating of the quality of the wafer, the quality of the wafer is determined as abnormal by comparing the feature value with the predetermined threshold or range, and
    a diagnosis of a state of the ion beam and diagnosis of a state of equipment of the ion implantation process are further performed, wherein when a number of wafers determined as abnormal exceeds a predetermined minimum, the ion beam or the state of equipment are diagnosed as defective.

8. The method of claim 7, wherein the state of the equipment is diagnosed by analyzing a dispersity of a plurality of feature values of a plurality of wafers calculated after the ion implantation process using the equipment.

9. The method of claim 1, further comprising providing feedback, to a user, including at least one of information about the quality of the wafer, information about a state of the ion beam, and information about a state of the equipment of the ion implantation process, after evaluating the quality of the wafer.

10. The method of claim 1, wherein the data about the ion beam includes data of an interruption mode or a park mode in which the ion implantation process is temporarily interrupted.

11. The method of claim 1, wherein the data about the ion beam includes data about noise.

12. The method of claim 1, wherein the second data is data extracted when the ion implantation process is suspended.

13. The method of claim 1, wherein the second data is data where a period of time when ions are injected in the ion implantation process is less than a predetermined threshold.

14. The method of claim 1, wherein the second data is data where an intensity of the ion beam is greater than a predetermined threshold.

15. The method of claim 1, wherein the Faraday cup is arranged within a width of the ion beam being projected into the wafer.

* * * * *